(12) United States Patent
Miyamura

(10) Patent No.: US 7,964,921 B2
(45) Date of Patent: Jun. 21, 2011

(54) MOSFET AND PRODUCTION METHOD OF SEMICONDUCTOR DEVICE

(75) Inventor: Makoto Miyamura, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 366 days.

(21) Appl. No.: 11/990,747

(22) PCT Filed: Aug. 22, 2006

(86) PCT No.: PCT/JP2006/316793
§ 371 (c)(1),
(2), (4) Date: May 7, 2008

(87) PCT Pub. No.: WO2007/023979
PCT Pub. Date: Mar. 1, 2007

(65) Prior Publication Data
US 2009/0250771 A1    Oct. 8, 2009

(30) Foreign Application Priority Data

Aug. 22, 2005    (JP) .................................. 2005-239861

(51) Int. Cl.
*H01L 29/78* (2006.01)
(52) U.S. Cl. ................. 257/402; 257/E21.409; 438/289
(58) Field of Classification Search .................. 257/402, 257/E29.255, E21.409; 438/289
See application file for complete search history.

(56) References Cited

U.S. PATENT DOCUMENTS

| | | | |
|---|---|---|---|
| 5,489,543 A * | 2/1996 | Hong | 438/291 |
| 5,766,998 A * | 6/1998 | Tseng | 438/291 |
| 6,501,131 B1 | 12/2002 | Divakaruni et al. | |
| 6,743,682 B2 * | 6/2004 | Woerlee et al. | 438/291 |
| 6,812,103 B2 * | 11/2004 | Wang et al. | 438/300 |
| 6,897,526 B1 | 5/2005 | Miyanaga et al. | |

FOREIGN PATENT DOCUMENTS

| | | |
|---|---|---|
| JP | 7-161978 | 6/1995 |
| JP | 11-233769 | 8/1999 |
| JP | 2001-68672 | 3/2001 |
| JP | 2001-77361 | 3/2001 |

* cited by examiner

Primary Examiner — Roy K Potter
(74) *Attorney, Agent, or Firm* — McGinn IP Law Group, PLLC

(57) ABSTRACT

To provide a MOSFET which is increased in substrate bias effect γ without increasing parasitic capacitance and junction leak current, the MOSFET includes: a gate electrode (104) formed on a semiconductor substrate (101) and an insulating film (103); a sidewall insulating film (106) covering the side surface of the gate electrode (104); and source/drain regions surrounded by the sidewall insulating film (106) and a shallow trench isolation (102) in a self-alignment manner, in which an impurity concentration of a first conductivity type which is the same type as a well-forming impurity has a profile becoming, in a lower direction of the gate electrode (104), lower in a channel formation region, then higher and again lower, and a high-concentration first conductivity type impurity region (110) is provided, in which the impurity concentration of the first conductivity type is formed to be low in the source/drain regions and to be high below the gate electrode (104) sandwiched between the source/drain regions.

20 Claims, 21 Drawing Sheets

MOSFET AND PRODUCTION METHOD OF SEMICONDUCTOR DEVICE

TECHNICAL FIELD

This invention relates to a semiconductor device, in particular, a MOSFET and a manufacturing method therefor, and more particularly, to an impurity profile in a lower direction of a gate and a formation method therefor.

BACKGROUND ART

In order to further attain high integration and high speed operation of a large scale integrated circuit (LSI), miniaturization of a metal-oxide semiconductor field effect transistor (MOSFET), which is a basic component thereof is promoted. This miniaturization is performed so as to keep the MOSFET device in a normal operation in accordance with a scaling rule in such a manner that three dimensional sizes of the device are reduced at the same time.

Important requirements for MOSFET scaling include, in addition to miniaturization of the tree dimensional actual sizes, reductions of a potential difference in a lateral direction crossing a source and a drain of a field effect transistor (FET) and a potential difference in a vertical direction viewed from a gate electrode at the same time, to thereby keep a constant field intensity itself inside the device. As the result of performing the above-mentioned scaling, reduction of a power voltage (Vdd) works effectively to reduce an operation voltage of the MOSFET, attaining the higher performance of the LSI year by year.

Meanwhile, as an adverse effect of the Vdd reduction, there arises a need to reduce a threshold voltage (Vth) to secure an operation current (Ion). For this reason, in device generations having a channel length of 1μ or less, the reduction of the threshold voltage causes a reason to markedly increase a leak current (sub-threshold leak current: Isb) flowing the source/drain when the FET is an off state. As a result, a merit of low power consumption in the LSI by virtue of the reduction of the Vdd is impaired.

In view of the above-mentioned backgrounds, there is investigated a technology to suppress the leak current by controlling not only the gate voltage but also a substrate bias (for example, refer to, T. Hiramoto, et al., Jpn. J. Appl. Phys., Vol. 40 (2001) 2854. (Non-patent Document 1)). It is found that a surface potential of a channel, which is essentially controlled by the gate electrode, is auxiliary controlled by applying a substrate bias, thereby being capable of controlling the Isb effectively.

In a case of a p-type MOSFET, for example, by applying a positive substrate bias thereto, the surface potential of the channel can be modulated into a positive direction. Therefore, it is required to apply a negative voltage more largely to the gate voltage to attain a formation of a reverse state at the channel portion. As a result, the threshold voltage becomes high. In a case of an n-type MOSFET, a reverse relation holds true in terms of voltage.

However, in the above-mentioned MOSFET, which requires a particularly high Ion, it is required to reduce an injection amount to the channel portion to lower the threshold voltage. For this reason, in a case where an electric field which is opposite to that of the gate electrode is applied to a substrate, a width of a depletion layer formed below the channel becomes wider, the above-mentioned substrate bias effect (hereinafter, abbreviated as "γ") becomes smaller as the miniaturization of the MOSFET advances.

Because it is required to increase an impurity concentration in a well to shorten the width of the depletion layer, there is generally employed a retrograde structure in which the impurity profile becomes higher as a depth in the substrate becomes deeper. However, when employing the retrograde structure, in the MOSFET of submicron generations, it is conceivable that the impurity concentration in a junction surface of the source/drain (hereinafter, source/drain may sometimes be referred to as "SD") may inevitably increase, or a junction capacitance or a junction leak current increases due to a crystal defect generated at the junction portion, thereby being not preferred in view of the MOSFET operation.

Besides, Japanese Unexamined Patent Application Publication (JP-A) No. 2001-68672 (Patent Document 1) describes a method involving injecting impurities from right above the channel portion while opening the gate electrode portion only, to improve device characteristics by varying the impurity concentration below the channel.

However, to improve the γ, it is required to form high impurity portion in the vicinity directly below the channel, so there was a problem in that it is difficult to form such an acute reverse profile without affecting the threshold voltage. Further, there is a fear of degrading the performance of the FET, because the crystal defects may be introduced into the channel portion as the injection of ion.

Besides, Japanese Unexamined Patent Application Publication (JP-A) No. Hei 11-233769 (Patent Document 2) discloses a method involving injecting, after the formation of the gate electrode, from <110> axis direction which causes channeling at the time of ion injection, to thereby inject the ion at a deep portion below the channel formation region. However, in a case of utilizing the channeling at the time of ion injection, if a slight shift occurs in the injection direction, the injection profile largely varies, resulting in being unable of providing a MOSFET as a product having stable characteristics. In addition, there was a great problem when manufacturing, because the injection is limited to the <110> direction, it is required to perform the ion injections each independently depending on the direction of the transistor integrated on the wafer.

DISCLOSURE OF THE INVENTION

Problem to be Solved by the Invention

As described above, there is such a tendency that a substrate bias effect (γ) is lowered as a miniaturization of a MOSFET, and to improve this, there was a need to increase a concentration of an impurity having the same type with a well below the channel. However, in the known method, there was a fear of degrading the MOSFET characteristics due to overlapping of a high concentration impurity region with an SD junction region. Further, in the disclosed method, there was a problem in that stable device characteristics can not be obtained such as being difficult to adjust a threshold voltage, or the like. It is therefore objects of this invention to solve the above-mentioned problems, to provide a MOSFET having an increased γ without increasing parasitic capacitance or junction leak current, and to provide a manufacturing method therefor.

Means to Solve the Problem

In order to solve the above-mentioned problems, features of this invention are to provide a novel and useful semiconductor device (MOSFET) having the same type of high concentration impurity region with a well mainly directly below a channel, and to provide a manufacturing method therefor.

More specifically, a MOSFET according to this invention is formed by including a step of forming a groove by etching an SD portion and a step of performing ion injection obliquely with respect to a gate portion. Note that, "directly below a channel" used in this invention refers to a region, which is about 10 nm or more deeper than a gate insulating film, has a deeper profile than a Halo injection region, and does not come into a strong inversion state at a MOSFET operation time.

That is, a MOSFET according this invention includes: a gate electrode formed on a semiconductor substrate and an insulating film; a sidewall insulating film covering the side surface of the gate electrode; and a source region and a drain region surrounded by the sidewall insulating film and a shallow trench isolation in a self-alignment manner, and is characterized in that an impurity concentration of a first conductivity type which is the same type as a well-forming impurity has a profile becoming, in a lower direction of the gate electrode, lower in a channel formation region, then higher and again lower, and a high-concentration first conductivity type impurity region is provided, in which the impurity concentration of the first conductivity type is formed to be low in the source region and the drain region and to be high below the gate electrode sandwiched between the source and drain region.

In the above-mentioned MOSFET according to this invention, it is preferred that the source region and the drain region be formed such that, on a line in a lateral direction crossing the source region and the drain region, the impurity concentration having the same type with the well is low in the source and drain region, is high at both ends adjacent to and sandwiched by the source and drain region, and is relatively low at a center portion of the source and drain region.

In the above-mentioned MOSFET according to this invention, it is preferred that the concentration of the first conductivity type impurity below the source region and the drain region be lower than the concentration of the high concentration impurity region below the gate electrode.

In the above-mentioned MOSFET according to this invention, it is preferred that the source region and the drain region be free from containing the first conductivity type impurity.

In the above-mentioned MOSFET according to this invention, it is preferred that the source region and the drain region be free from containing the first conductivity type impurity in a p-n junction surface.

In the above-mentioned MOSFET according to this invention, it is preferred that the source region and the drain region each include as a main structural element at least one element selected from Si, Ge, and C.

In the above-mentioned MOSFET according to this invention, it is preferred that the source region and the drain region be buried by a metal.

In the above-mentioned MOSFET according to this invention, it is preferred that the source region and the drain region be raised to a position which is higher than the substrate surface of the channel formation region.

A method of manufacturing a semiconductor device according to this invention includes: a semiconductor substrate; an insulating film; a gate electrode in the stated order; and a source region and a drain region surrounded by a sidewall insulating film covering a side surface of the gate electrode and a shallow trench isolation in a self-alignment manner, and is characterized by including the steps of: etching the source region and the drain region to form a recess after formation of the gate electrode; and obliquely ion-injecting, at a region of the semiconductor substrate below the gate electrode, a first conductivity type impurity having the same type with an impurity forming a well.

In the above-mentioned method of manufacturing a semiconductor device according to this invention, it is preferred that an angle of the ion injection with respect to a plane of the semiconductor substrate be larger than an angle determined by inverse tangent of a height of the gate electrode and a minimum interval of the gate electrode.

In the above-mentioned method of manufacturing a semiconductor device according to this invention, it is preferred that the injection direction of the ion injection be free from overlapping with a longitudinal direction of the gate electrode.

In the above-mentioned method of manufacturing a semiconductor device according to this invention, it is preferred to further include a step of annealing treatment for recovery of crystallinity of the semiconductor substrate after the ion injection.

In the above-mentioned method of manufacturing a semiconductor device according to this invention, it is preferred to further include selectively epitaxial-grow a material containing at least one element selected from the Si, Ge, and C at the recessed source region and the drain region.

In the above-mentioned method of manufacturing a semiconductor device according to this invention, it is preferred that an impurity opposite to a type of the well be introduced in the epitaxial growth.

In the above-mentioned method of manufacturing a semiconductor device according to this invention, it is preferred that an impurity having the same type with the well be introduced in the epitaxial growth.

In the above-mentioned method of manufacturing a semiconductor device according to this invention, it is preferred that in an early stage of the epitaxial growth, the introduction of the impurity opposite to the type of the well be performed by one of free from introducing and a small amount, and the introduction amount of the impurity opposite to the type of the well be increased thereafter to perform the epitaxial growth.

In the above-mentioned method of manufacturing a semiconductor device according to this invention, it is preferred that the source region and the drain region be raised to a higher position than the surface of the semiconductor substrate.

In the above-mentioned method of manufacturing a semiconductor device according to this invention, it is preferred that, after burying of the source region and the drain region, the sidewall insulating film be removed by etching and Halo injection and Extension injection are performed.

In the above-mentioned method of manufacturing a semiconductor device according to this invention, it is preferred to further include, after formation of the gate sidewall insulating film, a step of etching the source region and the drain region to form a recess.

EFFECT OF THE INVENTION

According to this invention, by recessing the substrate and by performing obliquely ion injection, the high concentration impurity region can be formed directly below the channel portion without overlapping with the source/drain region. As a result, it is possible to form a MOSFET in which the $\gamma$ can be increased without increasing parasitic capacitance or junction leak current. Further, the oblique injection provided by this invention is a parameter which can be adjusted separately from the conventional channel injection or Halo injection, so it is free from degrading other device characteristics.

BRIEF DESCRIPTION OF THE DRAWING

FIG. 5(b) is a schematic drawing illustrating a simulation result of an arsenic profile at an X=0.2 µm cross-section of the p-MOSFET. (Table 1, Condition B)

DESCRIPTION OF SYMBOLS

Figure 1A:
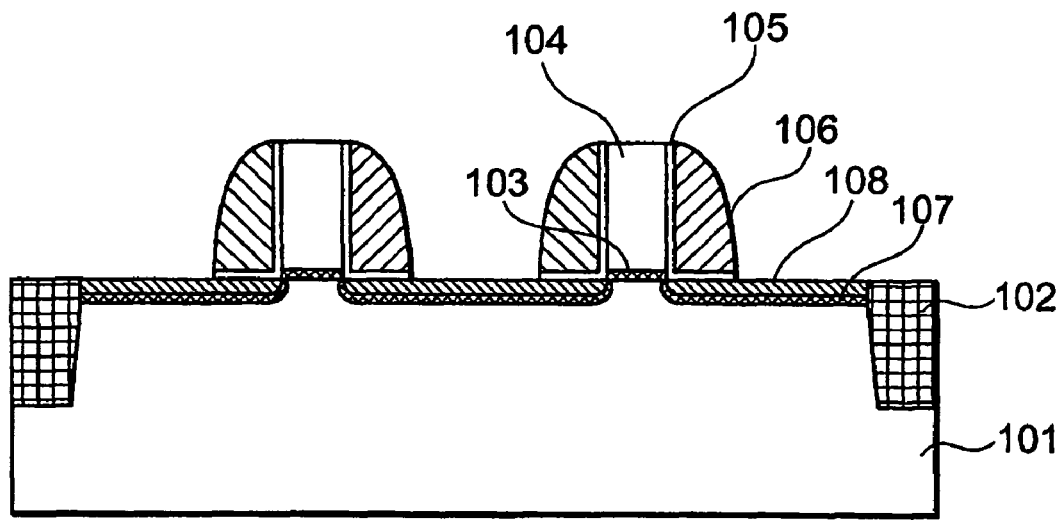
FIG. 1(a) is a schematic drawing illustrating a mode before an oblique injection is performed according to a MOSFET of this invention.

101, silicon substrate
102, shallow trench isolation
103, gate insulating film
104, gate electrode
105, offset spacer
106, gate sidewall
107, Halo injection region 108, SDE injection region
109, recess region
110, high concentration impurity region
201, wafer
202, longitudinal axis of gate electrode
203, ion injection direction
301, silicon substrate
302, gate insulating film
303, gate electrode
304, ion injection direction
1001, silicon substrate
1002, shallow trench isolation
1003, p-well region
1004, n-well region
1005, gate insulating film
1006, gate electrode
1007, offset spacer
1008, Halo injection region
1009, SDE injection region
1010, gate sidewall
1011, recess region
1012, mask
1013, high concentration impurity region (P)
1014, high concentration impurity region (N)
1015, source/drain region
1101, raised source/drain region
1201, silicon substrate
1202, shallow trench isolation
1203, gate insulating film
1204, gate electrode
1205, offset spacer
1206, Halo injection region
1207, SDE injection region
1208, gate sidewall
1209, recess region
1210, high concentration impurity region
1211, low concentration epitaxial region
1212, source/drain region
1301, silicon substrate
1302, shallow trench isolation
1303, gate insulating film
1304, gate electrode
1305, offset spacer
1306, gate sidewall
1307, recess region
1308, high concentration impurity region
1309, source/drain region
1310, Halo injection region
1311, SDE injection region
1312, gate sidewall
1401, silicon substrate
1402, shallow trench isolation
1403, gate insulating film
1404, gate electrode
1405, offset spacer
1406, recess region
1407, high concentration impurity region
1408, Epitaxial growth region
1409, Halo injection region
1410, SDE injection region
1411, gate sidewall
1412, source/drain region

BEST MODE FOR EMBODYING THE INVENTION

Figure 1B:
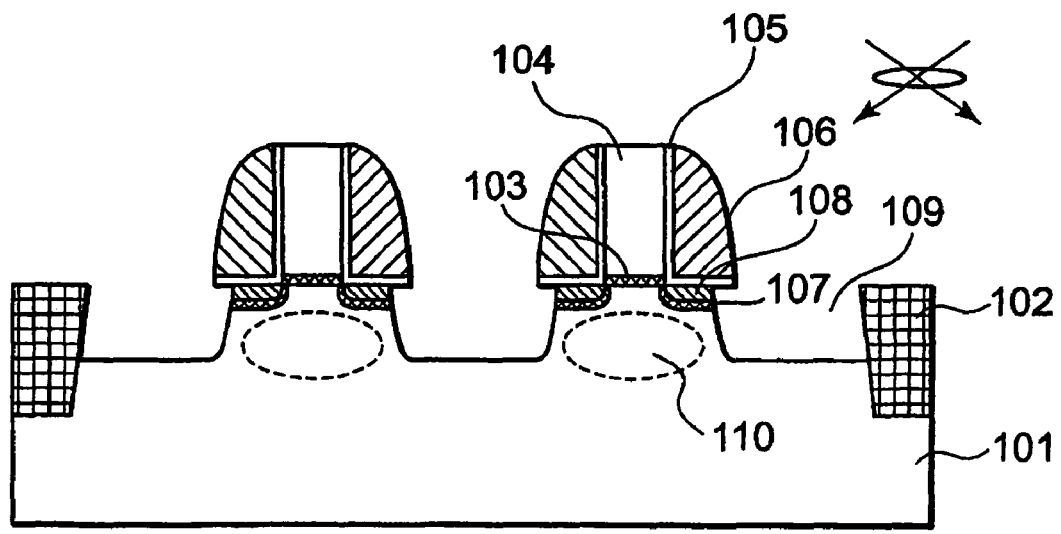
FIG. 1(b) is a schematic drawing illustrating an oblique injection mode according to the MOSFET provided by this invention.

Hereinafter, description is made of a gist of this invention with reference to FIGS. 1(a) and 1(b). A MOSFET according to this invention is formed by a salicide process, which is basically conventionally used. In other words, a shallow trench device isolation (STI) 102 is formed on the semiconductor substrate (mainly, silicon substrate) 101, and thereafter, a well injection is conducted to form p- and n-type regions each being isolated on the semiconductor substrate 101. The gate insulating film 103, the gate electrode 104, and the gate sidewall 106 are formed thereon by using a known method. In this case, source drain extension (SDE) injection 108, and Halo injection 107 may be performed in a self-alignment manner (FIG. 1(a)).

After that, a diffusion layer portion surrounded by the gate sidewall 106 and the STI 102 is etched to recess the portions corresponding to the source and drain regions. In this case, a part of the recess portion 109 may extend to a bottom of the gate sidewall 106. After that, an impurity 110 is introduced to the gate electrode 104 from an oblique direction. Ion injection is generally used, but other known method may be employed in place thereof (FIG. 1(b)).

If the source region and the drain region (SD region) are recessed, and then oblique ion injection is performed, there can be obtained the following points as remarkable effects thereof: the impurity can be introduced into directly below a channel with good controllability; an injection energy which is necessary for the process can be reduced, thereby being capable of minimizing a damage caused to the substrate; the source/drain region and the oblique injection region can be spatially separated from each other.

Kinds of the impurity (first conductivity type impurity in this invention) to be injected are ones that work as the same type with the well region, and, in general, phosphorus or arsenic is injected to a p-type MOSFET, boron or indium is injected into an n-type MOSFET.

An injection angle and the injection energy in the case of ion injection can be selected so that the impurity mainly remains at a portion below the gate electrode 104. However, in view of the position relation with an adjacent transistor, even in a case where the injection is performed by the most shallow angle, the angle is preferably an angle determined by inverse tangent of a ratio between a minimum interval of the gate electrode and a height of the gate electrode 104. Further, it is preferred to set the injection energy as low so that the impurity is not introduced into a part of the channel while penetrating the gate sidewall 106 and the gate electrode 104.

Figure 2:
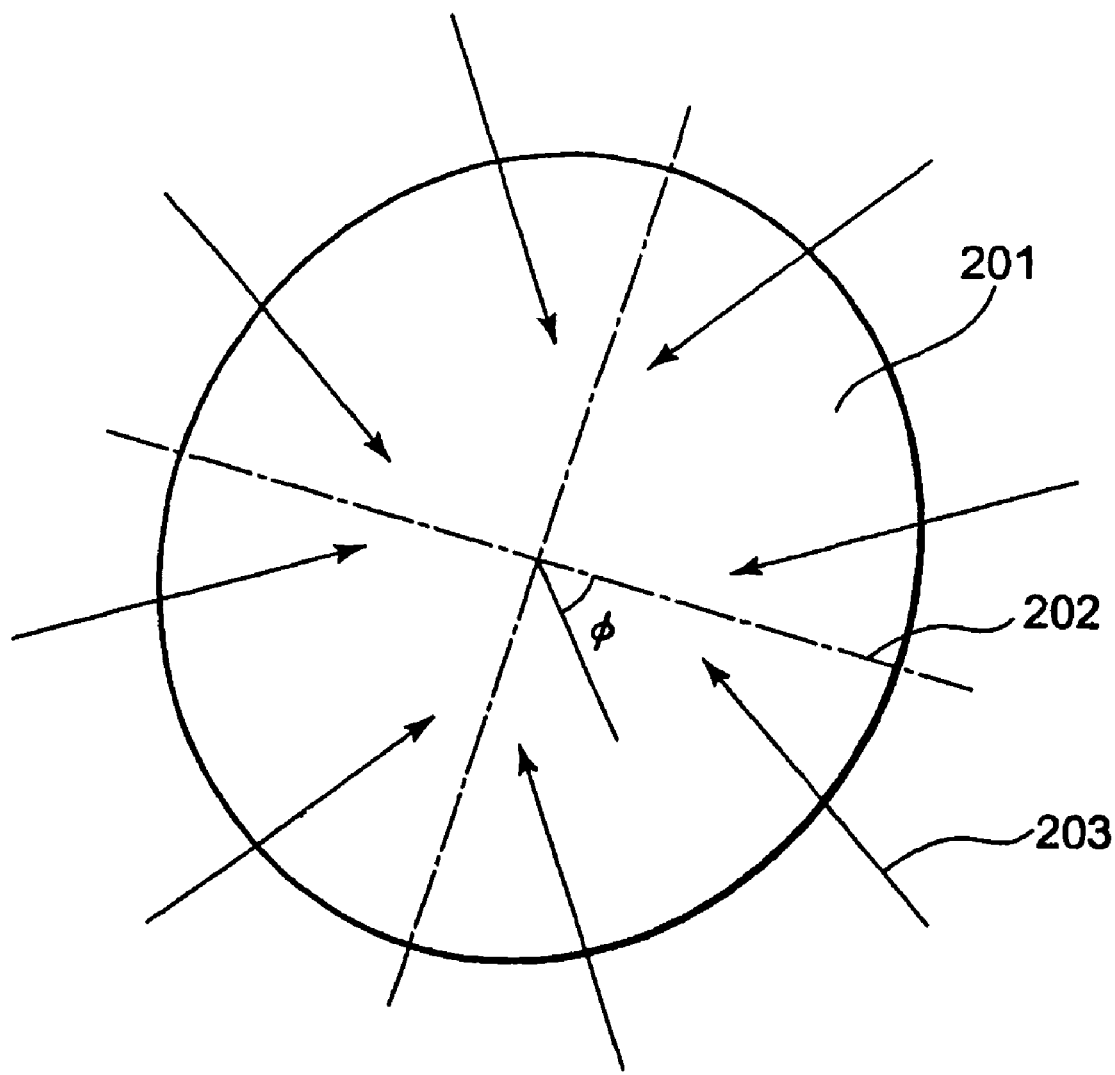
FIG. 2 is a schematic drawing illustrating a position relation with a wafer when an ion injection is performed.

A gate sidewall (sidewall insulating film) 106 is preferably formed of $Si_3N_4$ as a main component. The $Si_3N_4$ has, as shown in FIG. 2, a short average range distance compared with a matrix such as $SiO_2$, if the injection is performed in the same condition. For that reason, the effect as a mask for suppressing the impurity introduction into the channel portion is enhanced. In addition, another effect exists such as enhancing the selectivity of the growth between the source/drain portion and the gate sidewall 106 in a case where the recess portion 109 is buried back by the epitaxial growth.

In ordinal cases, the transistor is formed along two axes which are parallel to the wafer and are orthogonal to each other, so a wafer 201 is rotated while keeping a three-dimensional angle for injection, which being a general injection method. Also in this invention, the ion injection may be performed like that, however, it is further preferred to avoid the injection at an angle along a longitudinal direction of the transistor. In a case where an injection is performed, for example, from a vertical direction with respect to a longitudinal direction, by virtue of a shielding effect of the adjacent transistor and a mask pattern, as shown in FIG. 1(b), the ion is not injected into the SD portion, and the impurity can be introduced mainly directly below the gate. However, if the injection from the longitudinal direction is also included in the injection, because there is no obstruction which interrupts the injection into the source/drain portion, the amount of the impurity to be injected into the source/drain region is relatively increased. As an example of the impurity introduction, which avoids the injection from the longitudinal direction, for example, a method as shown in FIG. 2 may be recalled. In FIG. 2, an angle φ direction with respect to a longitudinal axis 202 of the gate electrode on the wafer 201 is employed as an ion injection direction 203, so the ion injection direction 203 and the longitudinal direction 202 of the gate electrode do not overlap with each other.

Figure 3:
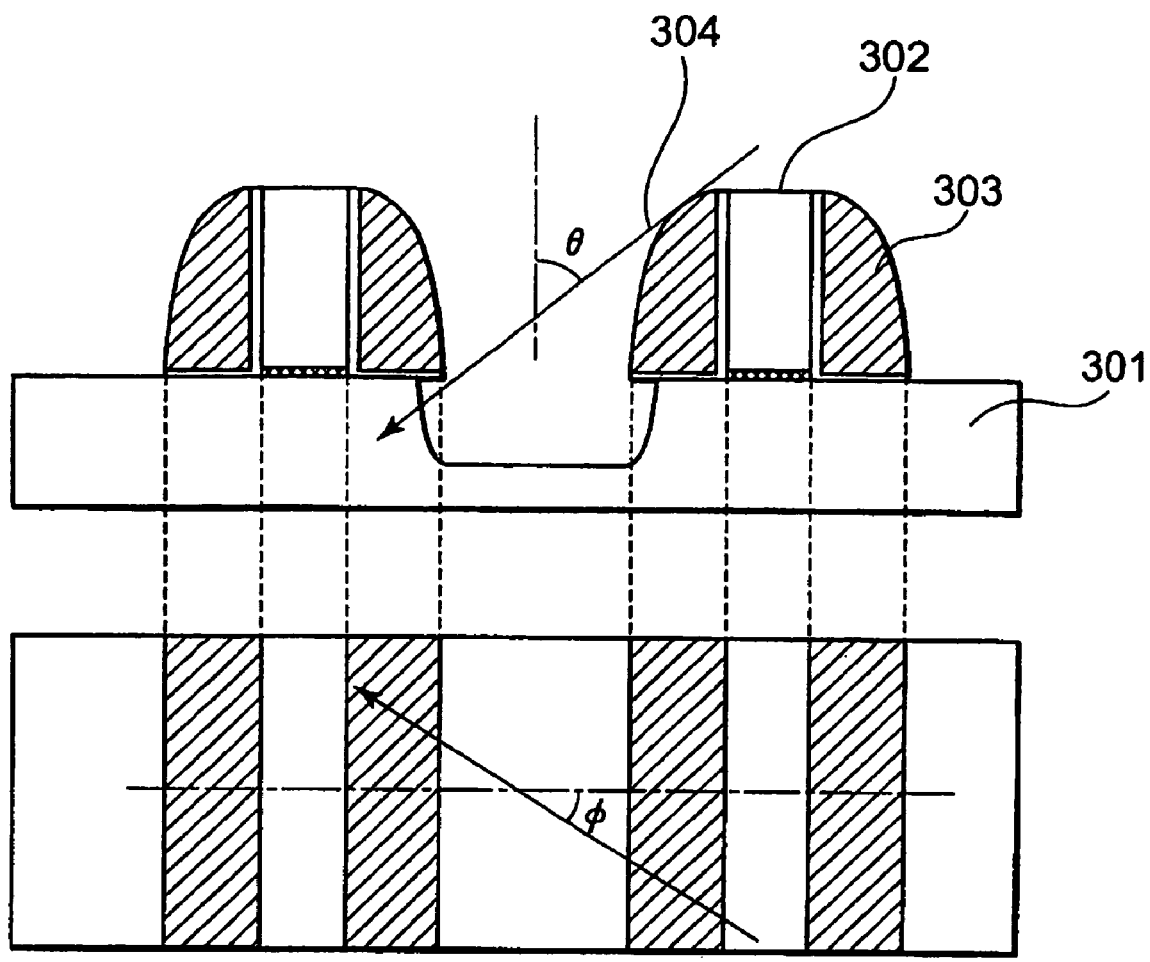
FIG. 3 is a schematic drawing showing a cross section and viewed from a top for illustrating a position relation with the MOSFET when the ion injection is performed.

When a relation between the gate shape and the injection angle is considered more specifically, it is found that the following relationship is established. In other words, in FIG. 3, when an angle of an ion injection axis 304 made by a normal line of the wafer is defined as θ, and an angle of the ion injection axis 304 made by a line vertically crossing the source/drain region is defined as φ (orientation flat angle), even if, for example, the injection angle is made shallow as much as possible while taking a shadowing of the adjacent transistor into consideration (angle formed by a normal line is made large), there is a need to satisfy the following relationship. Herein, Hpoly is a gate height, and Lpitch is a minimum gate electrode interval.

$$\theta max = \arctan\left(\frac{Hpoly \times \cos\phi}{Lpitch}\right) \quad (1)$$

In this equation 1, θ is a function of φ, and when φ is taken as large within a range of from 0 to 90°, θ, which is necessary for injecting the impurity into an identical point, can be set as shallow. Besides, if the shadowing is not the adjacent transistor but is the mask pattern such as a resist, Hpoly is read as a resist height, and Lpitch is read as a distance from the resist to the gate electrode, so the above relation is almost established.

From the fact described above, it is found that the profile formed below the gate electrode by the oblique injection is determined mainly by θ, φ, and the injection energy, so it is possible to design a two-dimensional optimum injection. However, in either cases, it is possible to suppress a spread of the depletion layer in a lateral direction from the SD below the channel. As a result, there can be obtained a MOSFET with a high substrate bias effect.

After the oblique ion injection, the recess region is buried back, and a silicide region is formed on the SD region by using a general salicide process. Besides, before burying back the recess region, anneal treatment may be performed, which also serves to attain the impurity activation, recovery of crystal defects (recovery of crystallinity of semiconductor substrate). Further, after the burying back, the ion injection may be performed into the SD region subsequently. With this process, the following processes may be performed in accordance with known transistor formation processes.

As a material for burying back the recess region, Si may be used, or a material having a close lattice constant with Si such as SiGe of SiGeC, namely, a material containing at least one from Si, Ge, and C may be selectively used for the epitaxial growth. In this case, at the time of the epitaxial growth, the impurity for forming the source/drain region may be introduced with in-situ dope. By taking this process, during the epitaxial growth, the doping amount may be changed, while the initial dose amount in the epitaxial growth is made relatively low, for example. By setting the dose amount at a p-n junction formation region as low, an inside electric field applied to the junction portion may be relaxed. Note that, the source/drain region may be buried by a metal. Further, in the epitaxial growth, an impurity having the same type with a well or an impurity having an opposite type with the well may be introduced.

Further, the epitaxial growth may be performed until a higher position than the original substrate surface of the channel region, to thereby form a raised source/drain structure. It is also possible to bury back the SD region using a metal material.

By injecting from an oblique direction like this, independently with the injection into the channel, Halo, or SDE portion, the impurity concentration directly below the channel can be set, so there is a high degree of device design freedom without impairing other device characteristics.

With the above-mentioned processes, there can be obtained a MOSFET having a high concentration impurity region having the same type with the well mainly directly below the channel portion only. This structure has a unique structure in which the impurity concentration having the same type with the well is low below the SD junction, and a region below the channel only is high. This unique structure can suppress the increase in the junction capacitance of SD or the junction leak to a minimum to enhance γ, thereby being an ideal structure. In addition, along with the enhancement of γ, it is possible to suppress an increase in a short channel effect due to impurity diffusion in a lateral direction in the SD region. As a result, lowering of the channel injection becomes possible, and there is a great merit in reducing a gate length. The merit in lowering the channel injection in the fine FET is remarkable in that impurity diffusion of a carrier running the channel can be reduced, and fluctuation of the threshold value due to the fluctuation of the injected impurity can be reduced, as well.

The impurity distribution, which is specific to this structure, can be distinguished by observing, for example, the cross section thereof by an electron beam holography method. Further, as described later, in a condition where a substrate bias is applied, there is shown a potential distribution which is inherent in this structure. However, as a method of measuring a surface potential of the cross section, scanning capacitance microscope (SCAM) or kelvin prove force microscopy (KPFM) may be used, with the result that observation of the potential distribution described above can be performed.

Now the description is made of the difference in the impurity distributions while comparing a case in which the above-mentioned oblique injection is performed as an example, a retrograde structure in which the impurity is injected into the entire well to obtain a reverse profile, and the conventional structure in which the impurity injection is not performed into a deep region of the channel. In addition, as an action thereof, there are shown simulation results of two-dimensional potential distribution when the substrate bias is applied, and the change in threshold voltage with respect to the substrate bias.

First, as for a p-type MOSFET formed on Si (100) plane, the simulation of the impurity distribution is performed using a device having a gate length of 30 nm, and a gate sidewall of 35 nm. Injection profile of the impurity is determined by the Monte Carlo method which deals with a lot of impurities. Further, the impurity to be injected comes fly from a surface crossing a top end of the gate electrode, and if the impurity passes one end of a simulation region (X=0-0.4 μm), the impurity is introduced from the other end by a periodic boundary condition.

In this case, the injection conditions of Halo and SDE are made identical in the above-mentioned three kinds of structures, and the following conditions are employed for respective structures: arsenic 25 keV, injection angle: 30° from a normal line of the wafer, dose amount 1.7E13 (=$1.7 \times 10^{13}$) at/cm$^2$ (Halo condition), and BF 21.2 keV, injection angle: vertical to the wafer, dose amount 7E14 (=$7 \times 10^{14}$) at/cm$^2$ (SDE condition). In this case, as a sidewall spacer, an oxide film of 7 nm is used.

The channel injection condition and the oblique injection condition are each summarized in Table 1. In a case where the oblique injection is performed after the source/drain is recessed, etching is performed to a region, which is 35 nm in depth and 15 nm below the sidewall nitride film, oblique injection, and 1,300° C. for 300 µsec of activation annealing is performed, and thereafter, the region was buried back to the substrate surface by non-doped Si. The source/drain region is formed by being injected boron 2.7 keV, at an injection angle: 7° from a normal line of the wafer, by a dose amount of 5E15 (=$5 \times 10^{15}$) at/cm$^2$, and by being subjected to activation annealing at 1,300° C. for 300. The thermal diffusion of the impurity is calculated using a vacancy diffusion model.

TABLE 1

|  | channel injection | Oblique injection | recess |
| --- | --- | --- | --- |
| Condition A | arsenic: 75 keV, 6E12 atom/cm$^2$, 7° | none | none |
| Condition B | arsenic: 140 keV, 3E13 atom/cm$^2$, 7° | none | none |
| Condition C | arsenic: 75 keV, 1E12 atom/cm$^2$, 7° | Arsenic: 55 keV, 3E13 atom/cm$^2$, 55° | exist |

Figure 4A:
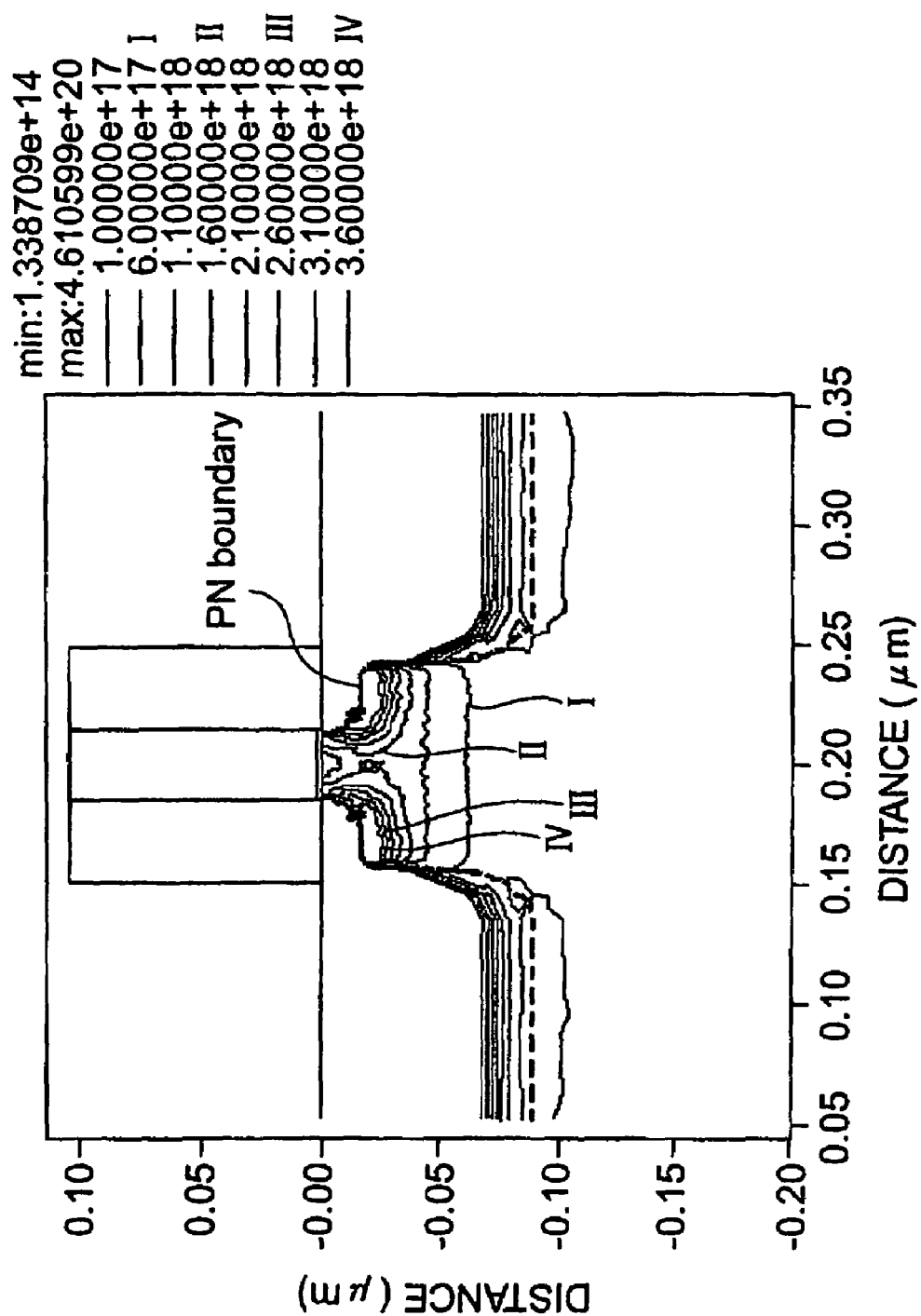
FIG. 4(a) is a schematic drawing illustrating a simulation result of two-dimensional donor distribution of a p-MOSFET. (Table 1, Condition A)
Figure 4B:
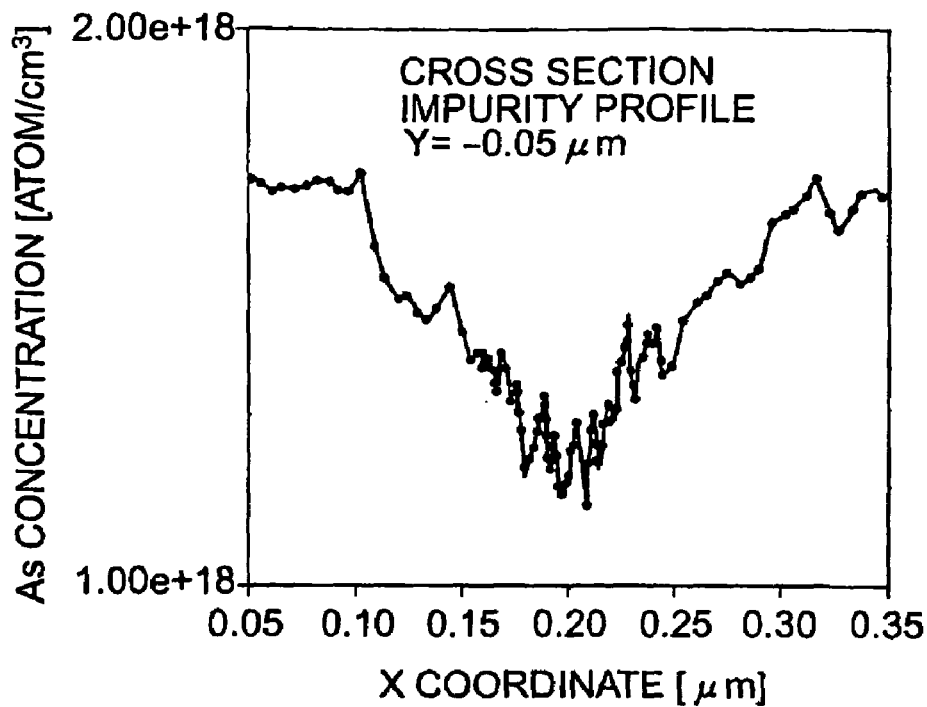
FIG. 4(b) is a schematic drawing illustrating a simulation result of an arsenic profile at a Y=−0.05 µm cross-section of the p-MOSFET. (Table 1, Condition A)
Figure 4C:
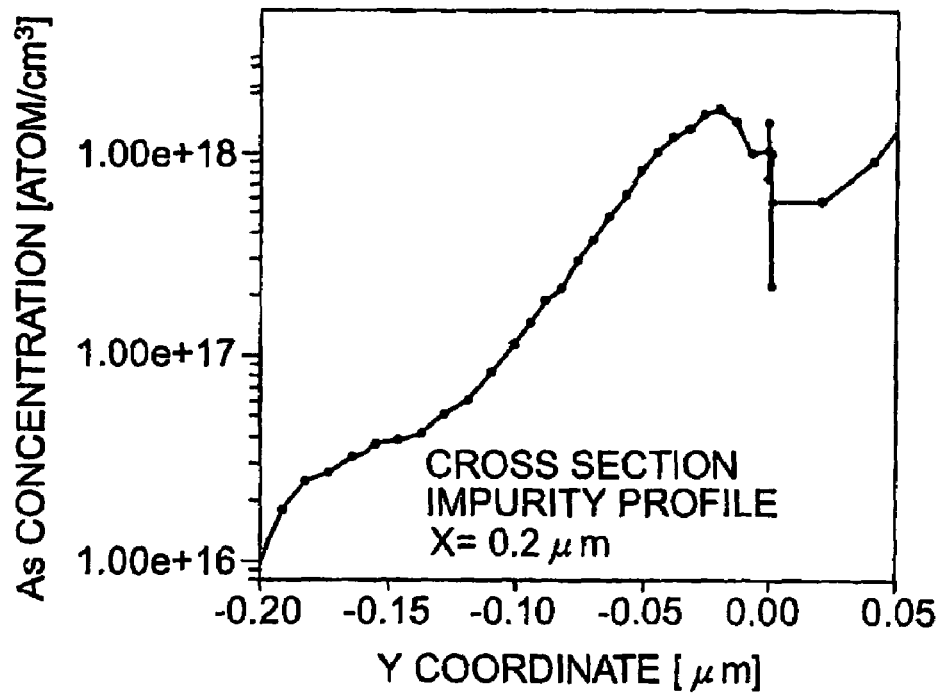
FIG. 4(c) is a schematic drawing illustrating a simulation result of an arsenic profile at an X=0.2 µm cross-section of the p-MOSFET (Table 1, Condition A)

FIGS. 4(a) to 4(c) each show a two-dimensional net donor distribution (if acceptor concentration is higher, adopts a negative value; FIG. 4(a)) in a structure in which, as a conventional example, only channel injection is performed and impurity injection is not performed into a depth region of the channel (corresponds to condition A in Table 1), and a one-dimensional arsenic profile of respective cross-sections at Y=−0.05 µm (FIG. 4(b)) and X=0.2 µm (FIG. 4(c)). In this condition, when seeing the lower direction of the gate electrode, there has such a tendency that the channel region has the highest donor concentration and the donor concentration gradually reduces toward the substrate side.

Figure 5A:
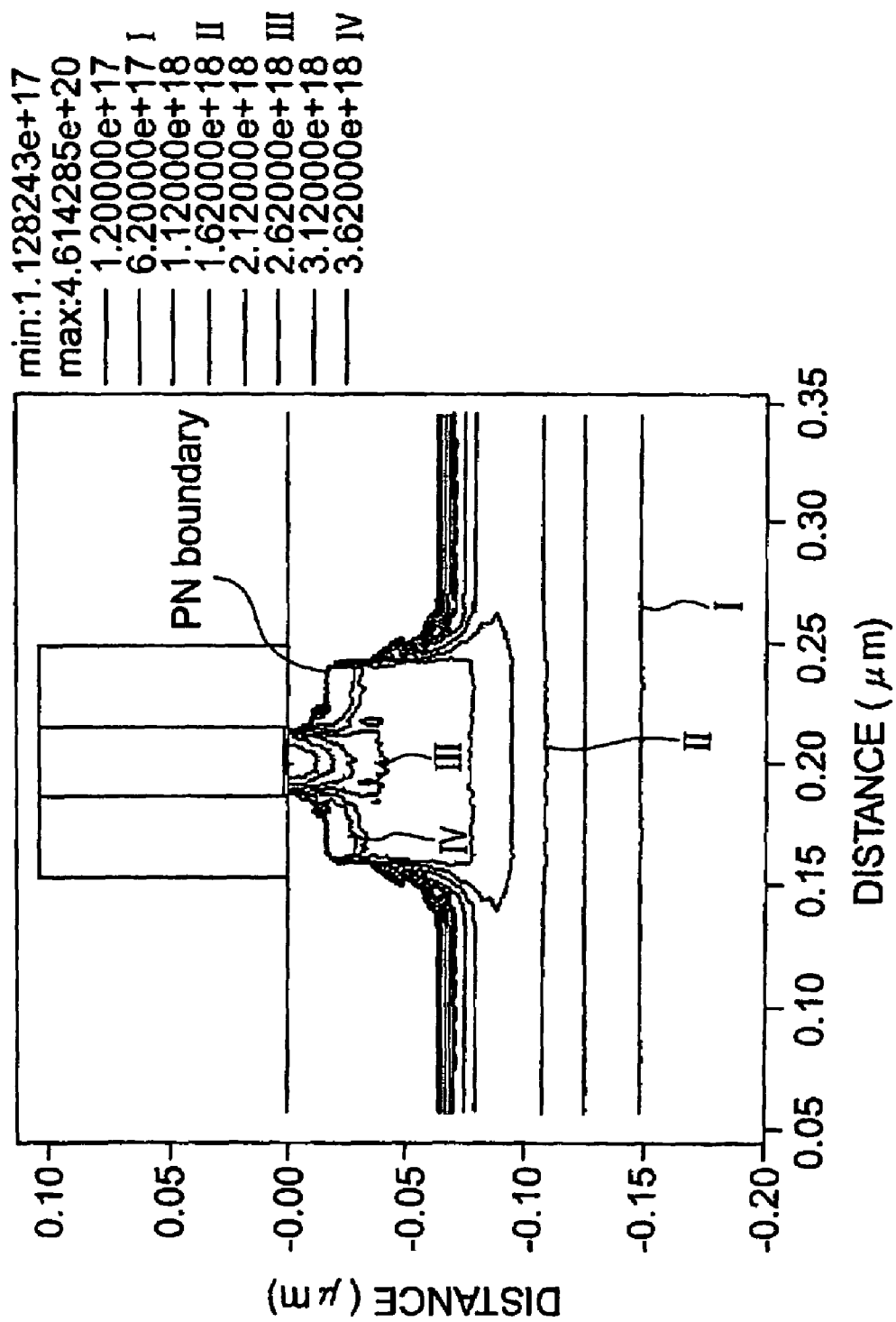
FIG. 5(a) is a schematic drawing illustrating a simulation result of two-dimensional donor distribution of the p-MOSFET. (Table 1, Condition B)
Figure 5B:
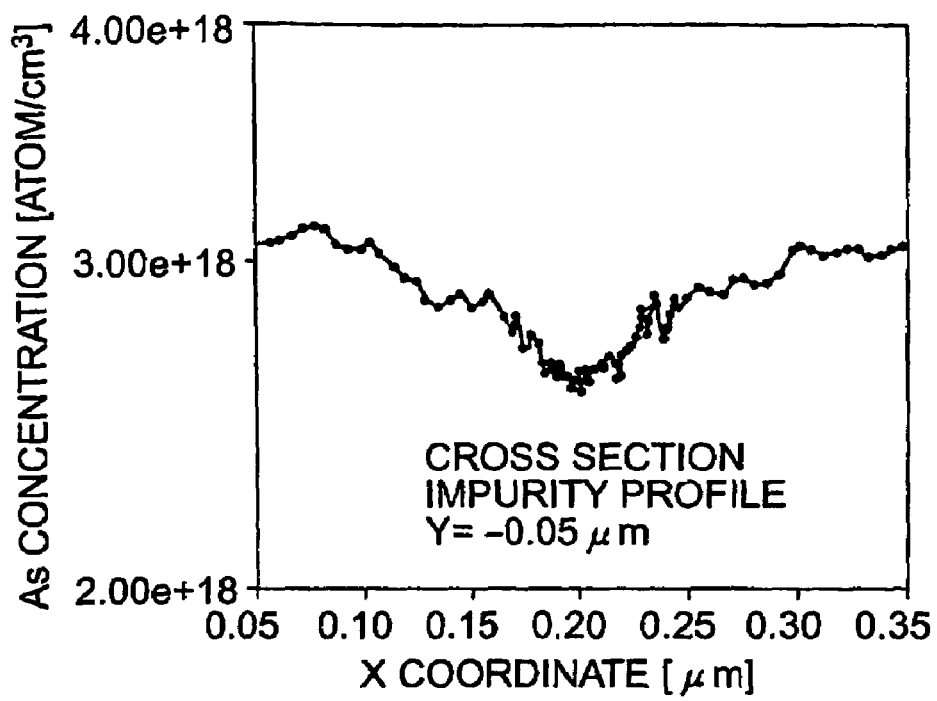
FIG. 5(b) is a schematic drawing illustrating a simulation result of an arsenic profile at a Y=−0.05 µm cross-section of the p-MOSFET (Table 1, Condition B)
Figure 5C:
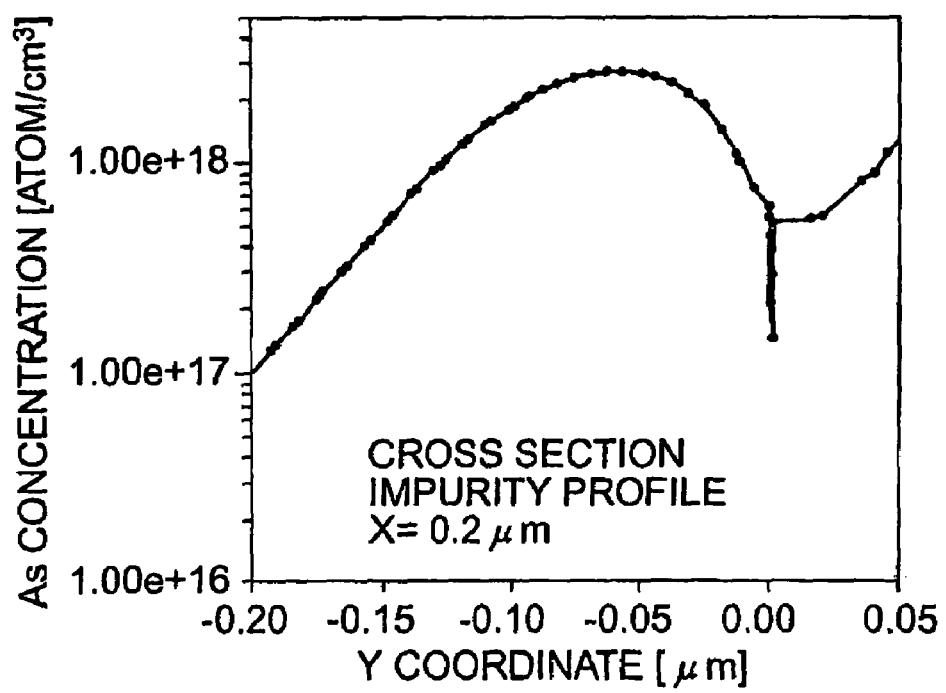

FIG. 5(a) to 5(c) each show an impurity concentration of a structure in which the impurity concentration of the substrate has an inverse gradient (retrograde structure: Table 1, Condition B). To be specific, FIG. 5 show a two-dimensional net donor distribution in Table 1, Condition B (FIG. 5(a)), and show a one-dimensional arsenic profile of respective cross-sections at Y=−0.05 µm (FIG. 5(b)) and at X=0.2 µm (FIG. 5(b)). As can been seen from a cross-section in a Y direction (FIG. 5(b)), it is found that the donor concentration is highest at a region which is deeper from 0.05 to 0.1 µm towards substrate compared with a substrate surface. The reverse profile may variously be formed. However, to increase the substrate bias effect, it is important that the impurity concentration from the substrate surface to about 0.1 µm be high. In the MOSFET generations having a gate length of 100 nm or shorter, there arises such a problem that the SD boundary and the high concentration region of the retrograde structure overlaps with each other.

Figure 6A:
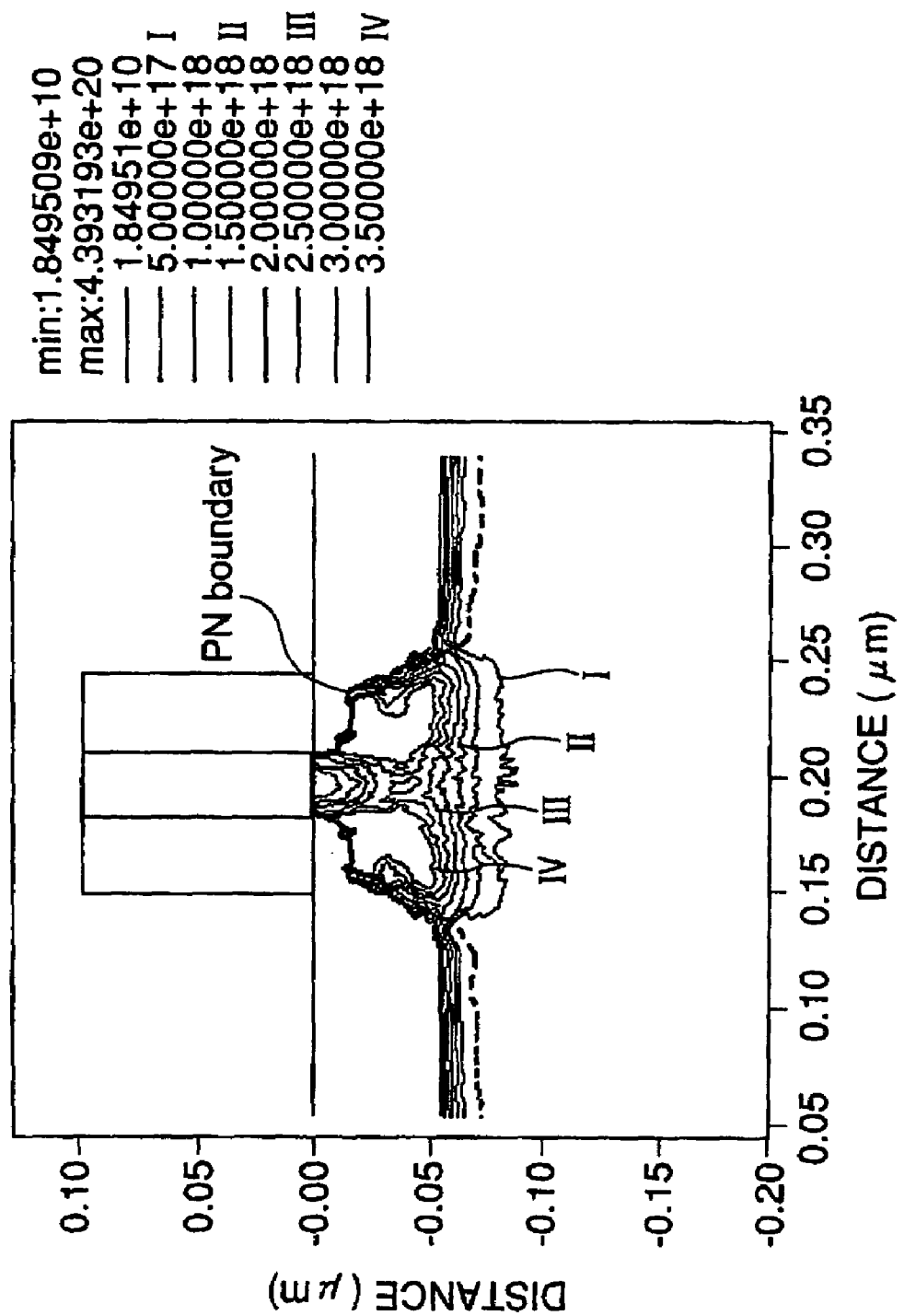
FIG. 6(a) is a schematic drawing illustrating a simulation result of two-dimensional donor distribution of the p-MOSFET. (Table 1, Condition C)
Figure 6B:
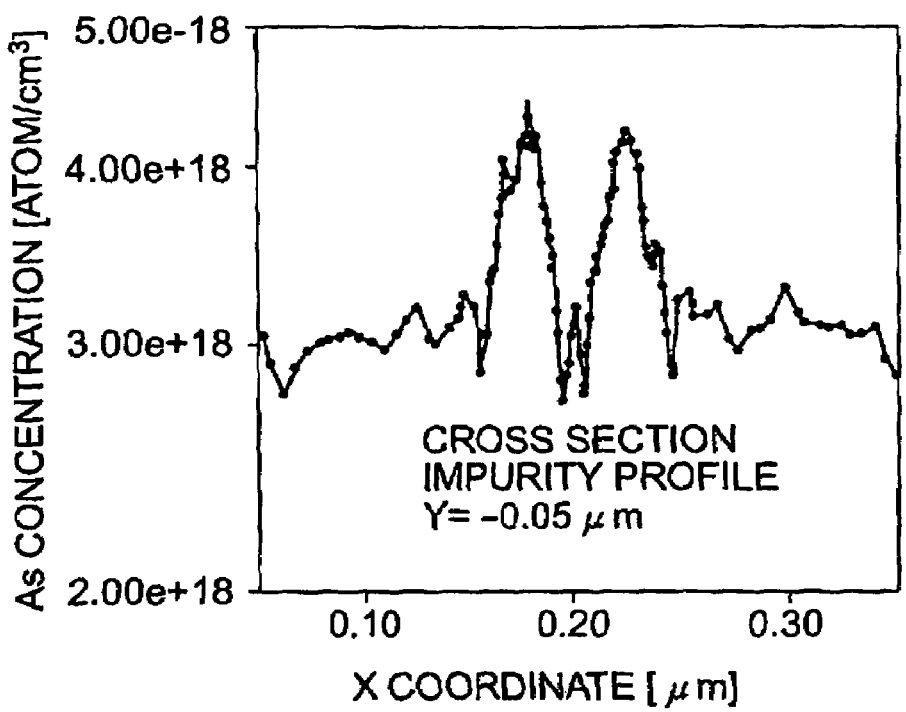
FIG. 6(b) is a schematic drawing illustrating a simulation result of an arsenic profile at a Y=−0.05 µm cross-section of the p-MOSFET. (Table 1, Condition C)
Figure 6C:
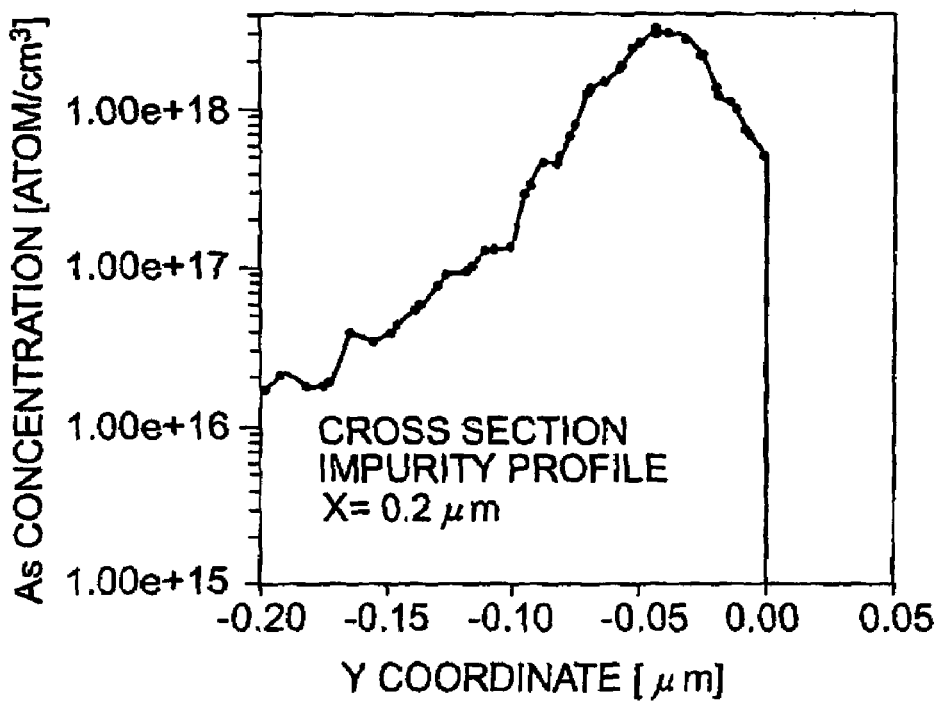
FIG. 6(c) is a schematic drawing illustrating a simulation result of an arsenic profile at a Y=−0.05 µm cross-section of the p-MOSFET. (Table 1, Condition C)

FIG. 6(a) to 6(c) each show the impurity distribution of a case in which the ion injection was performed obliquely into a substrate region below the gate electrode after recessing the source/drain region (Table 1, Condition C). To be specific, FIG. 6 show a two-dimensional net donor distribution in Table 1, Condition C (FIG. 6(a)), and a one-dimensional arsenic profile of respective cross-sections at Y=−0.05 µm (FIG. 6(b)) and X=0.2 µm (FIG. 6(c)). In this case, as can been seen from a cross-section in a Y direction (FIG. 6(b)), it is found that the donor concentration is higher at a portion below the channel compared with the substrate surface. In addition, from a cross-section in an X direction, (FIG. 6(c)), it is found that the donor concentration is higher at a portion below the channel compared with the SD region. This type of structure can not be obtained by the above-mentioned two conditions. This is a unique structure which can be formed by performing obliquely ion injection into the substrate region below the gate electrode after recessing the source/drain region.

Figure 7A:
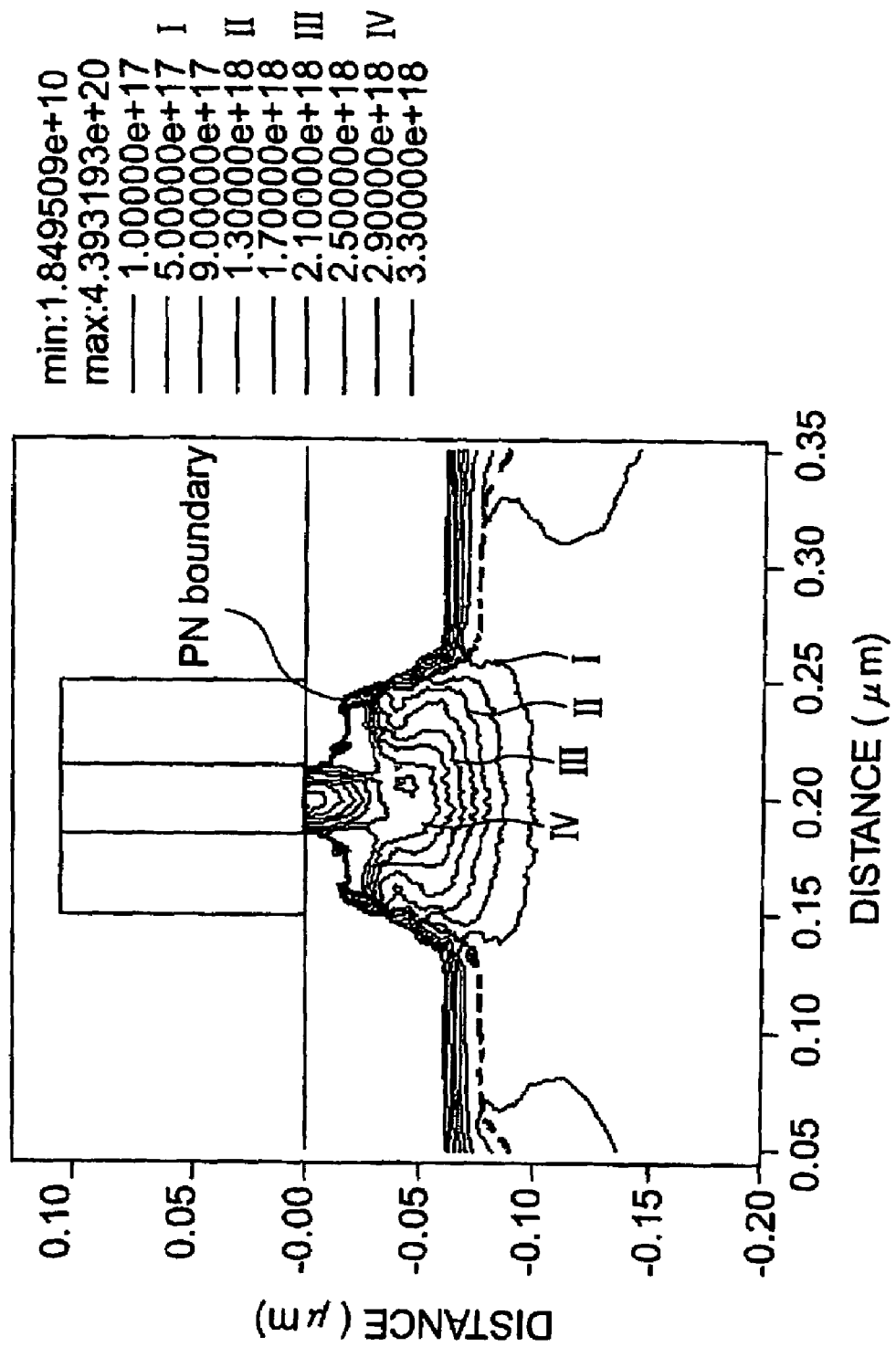
FIG. 7(a) is a schematic drawing illustrating a simulation result of two-dimensional donor distribution of the p-MOSFET. (Table 1, Condition C')
Figure 7B:
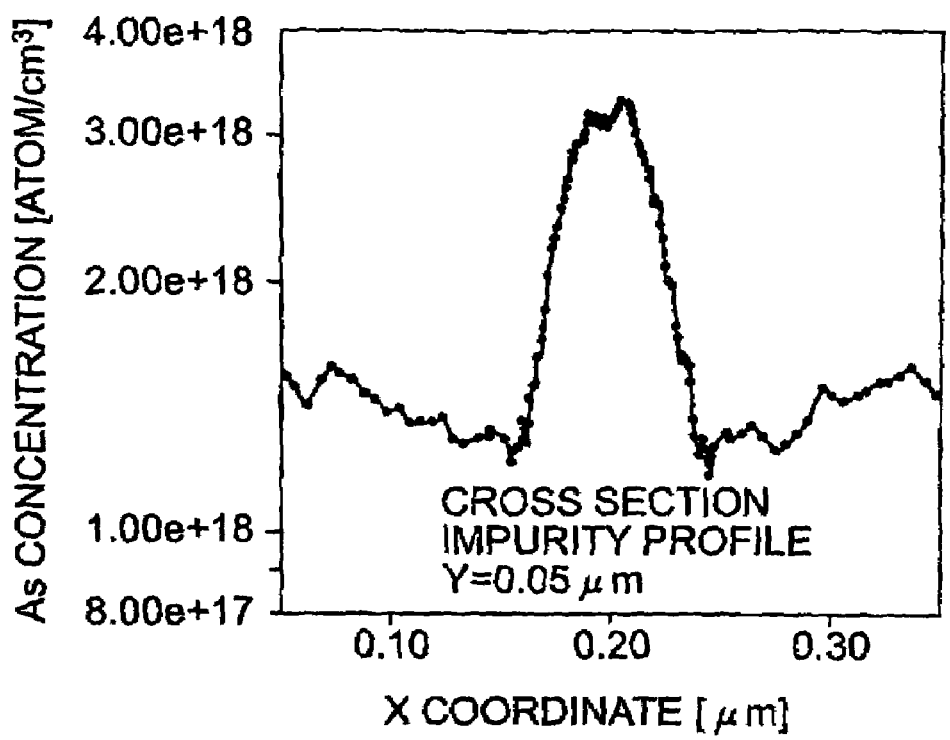
FIG. 7(b) is a schematic drawing illustrating a simulation result of an arsenic profile at a Y=−0.05 µm cross-section of the p-MOSFET (Table 1, Condition C')
Figure 7C:
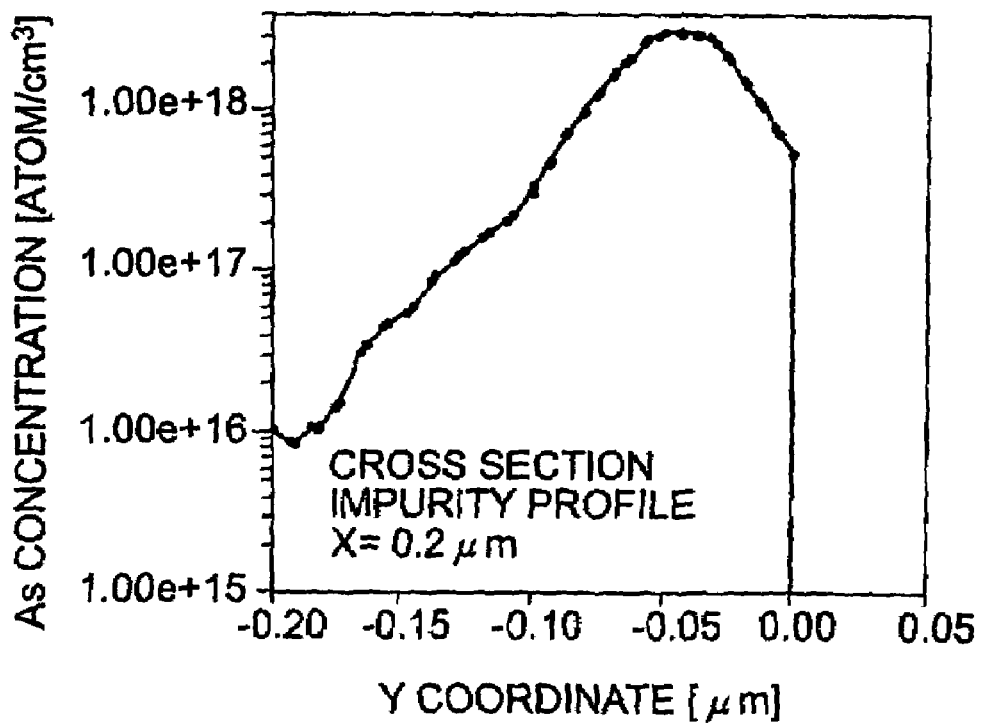
FIG. 7(c) is a schematic drawing illustrating a simulation result of an arsenic profile at an X=0.2 µm cross-section of the p-MOSFET. (Table 1 Condition C')

Further, in Table 1, Condition C, the oblique injection after recessing is performed while rotating the substrate. However, if the injection amount, injection angle, and injection energy are fixed, and the injection direction is obliquely performed from a direction which is vertical with respect to the longitudinal direction of the gate electrode. (Condition C'), impurity distributions shown in FIGS. 7(a) to 7(c) are obtained. Specifically, FIG. 7 show a two-dimensional net donor distribution in Table 1, Condition C' (FIG. 7(a)), and a one-dimensional arsenic profile of respective cross-sections at Y=−0.05 µm (FIG. 7(b)), and X=0.2 µm (FIG. 7(c)). In this case, kinetic energy in a direction vertical to the gate electrode increases, so the impurity reaches at a deeper region. As a result, it is found that profiles to be injected from both side may overlap with each other.

As described above, in the case of the oblique injection, due to the injection direction, injection angle, and injection energy, the two-dimensional impurity profile of the region directly below the gate electrode varies variously. However, either case has the following features: the donor concentration at a deeper portion below the channel is higher compared with the substrate surface; and the donor concentration is a maximum when seen from a line connecting the SD regions and is parallel with the substrate, the donor concentration becomes maximum at a portion below the gate electrode. In addition, from the simulations made by the inventors of this invention, it becomes apparent that as long as having such features, the substrate bias effect will be increased.

As described above, in the MOSFET of this invention, the concentration of the first conductivity type impurity which is the same type with the impurity forming the well has such a profile becoming, in the lower direction of the gate electrode, lower in the channel formation region, then higher and lower again. Further, the MOSFET has such a structure that the first conductivity type impurity concentration is low in the source region and the drain region, and has a high concentration impurity region below the gate electrode sandwiched between the source region and the drain region. Furthermore, it is preferred that, on a line in a lateral direction crossing the source region and the drain region, the impurity concentration having the same type with the well be low in the source and drain region, be high at both ends adjacent to and sandwiched by the source and drain region, and be relatively low at a center portion of the source and drain region, and is more preferred that the concentration of the first conductivity type impurity below the source region and the drain region be lower than the concentration of the high concentration impurity region below the gate electrode. In addition, the source region and the drain region may be configured to be free from containing the first conductivity type impurity, and the source region and the drain region may be configured to be substantially free from containing the first conductivity type impurity in a p-n junction surface.

Figure 8A:
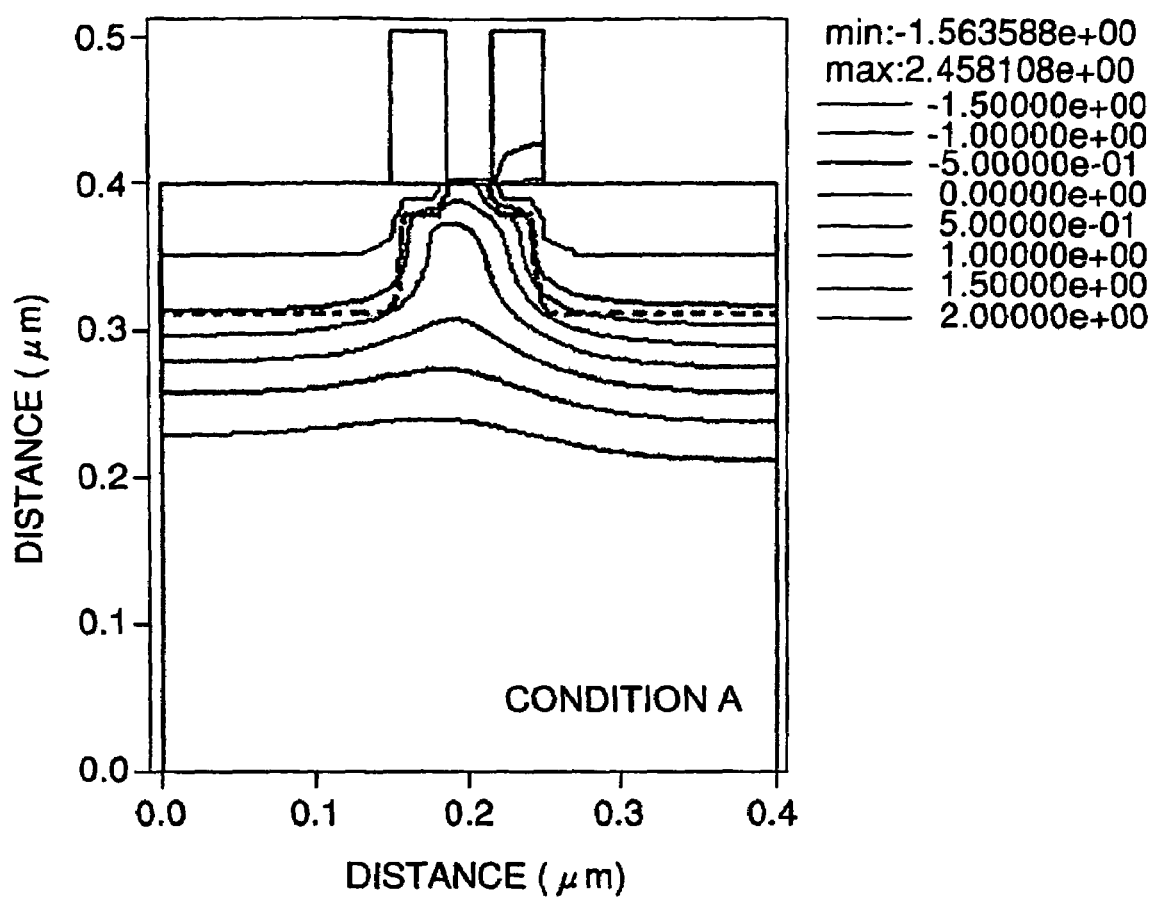
FIG. 8(a) is a schematic drawing illustrating a simulation result of two-dimensional potential distribution corresponding to Table 1, Condition A.
Figure 8B:
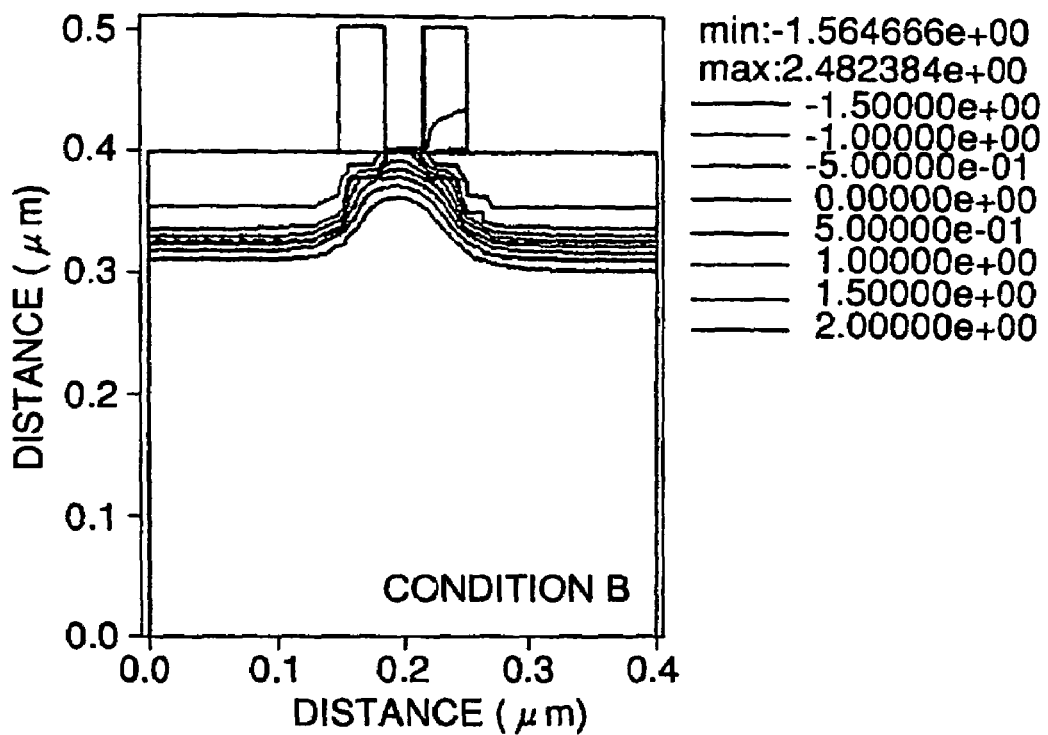
FIG. 8(b) is a schematic drawing illustrating a simulation result of two-dimensional potential distribution corresponding to Table 1, Condition B.
Figure 8C:
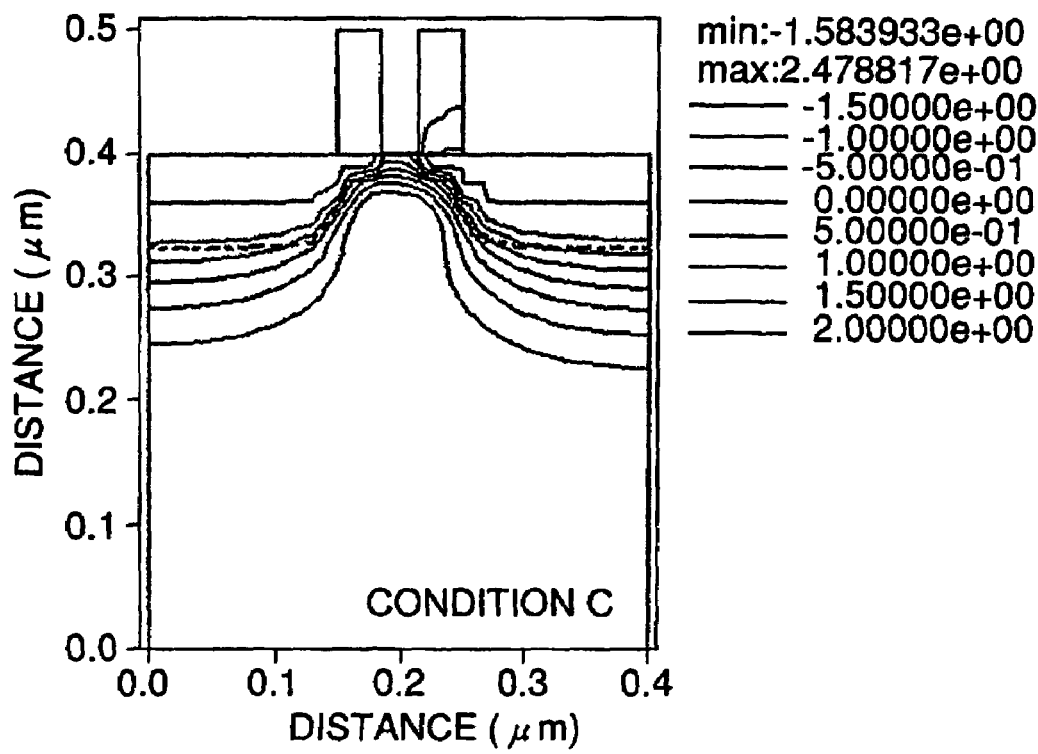
FIG. 8(c) is a schematic drawing illustrating a simulation result of two-dimensional potential distribution corresponding to Table 1, Condition C.

Next, calculation results of the two-dimensional electric field distribution under Conditions A to C in Table 1 are shown in FIGS. 8(a) to 8(c). Numerals indicated by contours in the figures are represented on the basis of potentials of Si conduction band. Note that, applied as the respective potentials to the source and the gate electrode region is 0 V, and −1 V is applied to the drain region, and 2 V is applied to the substrate region.

Referring to FIGS. 8(a) to 8(c), it is found that the spread of the depletion layer below the gate electrode under Conditions B and C is small compared with Condition A. In this case, the substrate bias effect y is a modulation degree of the surface potential due to a substrate applied voltage. Accordingly, when the gate capacitance is defined as Cox, and the depletion layer capacitance of the substrate is defined as Cd, the following relation expressed by Equation 2 is established in most simply.

$$\gamma \alpha \frac{Cd}{Cox} \quad (2)$$

Therefore, as the spread of the depletion layer is small as possible, the Cd increases, it is found that the substrate bias effect may be improved in such a structure that the well impurities of Conditions B and C have a reverse profile.

Besides, comparing the potential distributions under Condition B and Condition C, it is found that the spread of the depletion layer below the source/drain region is larger in Condition C. Those features are originated from a unique structure of this invention, in which the impurity concentration having the same type with the well is low below the source/drain region, and a region below the channel only is high. As a result, the useful effect is generated compared with the conventional retrograde structure (Condition B), such as being small in the source/drain capacitance, and also becoming smaller in injunction leak. This tendency does not depend on the value of the substrate bias, for example, even in the case where the substrate bias is made identical to the source potential, the same is true.

Figure 9:
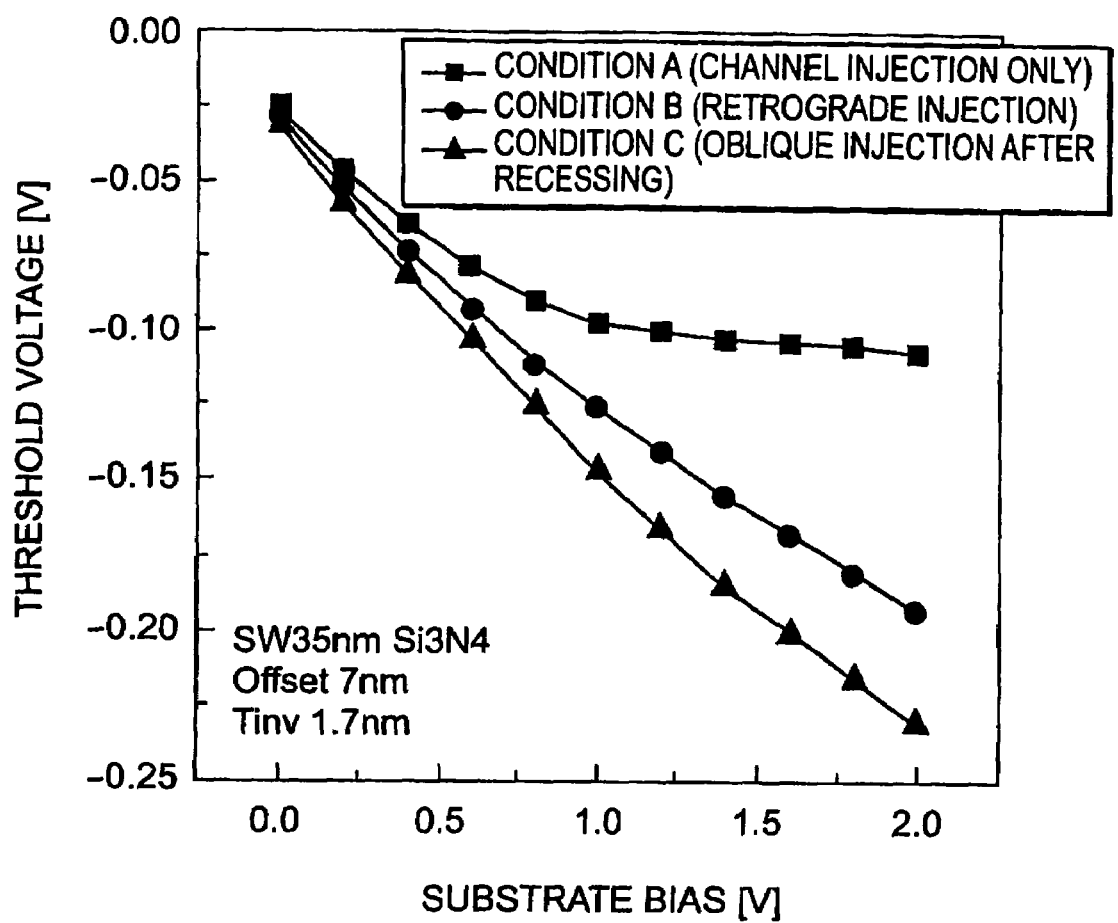
FIG. 9 is a schematic drawing illustrating a simulation result of threshold voltage dependency on a substrate bias voltage with respect to Table 1, Conditions A, B, and C.

FIG. 9 is a graph showing the threshold voltages for three structures obtained under Conditions A, B and C, in the case where 0 V is applied to the source and the gate electrode region, and −1 V is applied to the drain region, and the substrate bias is changed from 0 V to 2 V. Inverse film thickness (Tinv) of this case is set to 1.7 nm, and the threshold voltage is defined by the gate voltage so that the current flowing between the source/drain becomes 1 μA/μm. As shown in FIG. 9, it is found that the substrate bias effect is markedly improved in Conditions B and C.

Further, the above-mentioned detailed discussion is made of a p-type MOSFET as an example, it is needless to say that an n-type MOSFET may also be described by the same way.

As described above, the ion injection is obliquely performed into the substrate region below the gate electrode after recessing the source/drain region. As a result, there is shown an enhancement of the substrate bias effect is achieved to the conventional MOSFET without increasing the injunction leak or the injunction capacitance.

Next, embodiments of a method of manufacturing a semiconductor device (MOSFET) according to this invention are described in detail by way of a first embodiment and a second embodiment with reference to the drawings. It should be noted that about the formation methods of respective parts of the embodiments disclosed herein are exemplified by only essential processes, in actual manufacturing of a MOSFET, it is needless to say that various processes which are not included in embodiments of this invention may be employed.

Further, the sizes of the respective parts, the ion injection energy, and the injection amount may be altered unless otherwise the scope of this invention is not changed, and it is not construed to limit the scope of implementation of this invention.

First Embodiment

Referring to the drawings, a method of manufacturing a semiconductor device according to a first embodiment of this invention is described.

EXAMPLE 1-1

Referring to FIGS. 10(a) to 10(f), a method of manufacturing a semiconductor device according to Example 1-1 of the first embodiment of this invention is described. First, in FIG. 10(a), by a conventional know method, a device isolation region 1002 is formed on an Si substrate 1001 by a shallow trench isolation (trench isolation) using a device isolation oxide film. Into the device isolation region 1002, a p-type or an n-type impurity is ion-injected, an annealing is performed to form a p-well region 1003 and an n-well region 1004, respectively, and the necessary channel injection is performed, and a gate insulating film 1005 is formed thereafter.

Figure 10A:
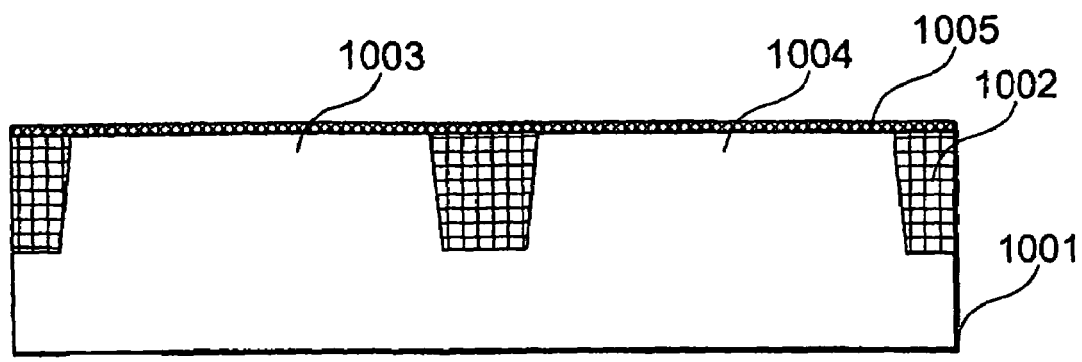
FIG. 10(a) is a first manufacturing process drawing of a semiconductor device according to Example 1-1 of a first embodiment of this invention.
Figure 10B:
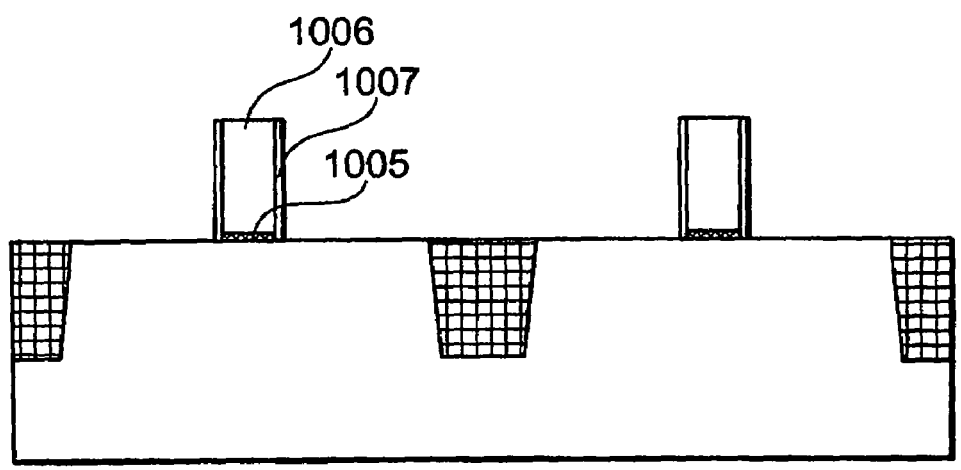
FIG. 10(b) is a second manufacturing process drawing of the semiconductor device according to Example 1-1 of the first embodiment of this invention.

Subsequently, a polysilicon layer having a film thickness about 10 nm is formed. In this case, polysilicon germanium may be used in place of the polysilicon. Then, a resist pattern obtained by patterning is transferred on a hard mask formed on the polysilicon layer, and an etching of the polysilicon layer is performed by using the hard mask pattern. After that, the hard mask on the polysilicon layer is removed to form a gate electrode 1006 formed of polysilicon as shown in FIG. 10(b). In this case, the gate insulating film 1005 may be etched simultaneously. After that, about 5 nm of a shallow offset spacer 1007 is formed through a sidewall oxide film formation and an etchback.

Figure 10C:
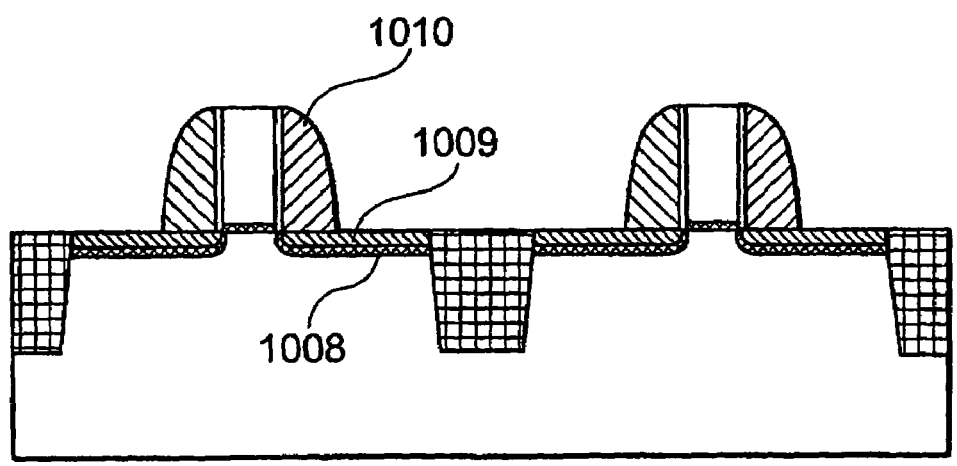
FIG. 10(c) is a third manufacturing process drawing of the semiconductor device according to Example 1-1 of the first embodiment of this invention.

Next, as shown in FIG. 10(c), Haloion injection region 1008 and SDE diffusion region 1009 are formed on both sides of the gate electrode 1005 through the ion injection. After that, heat treatment is performed to activate the impurity of the ion injection region. Next, an oxide film, a nitride film, or a lamination film thereof is deposited, and a gate sidewall 1010 is formed through etchback.

Figure 10D:
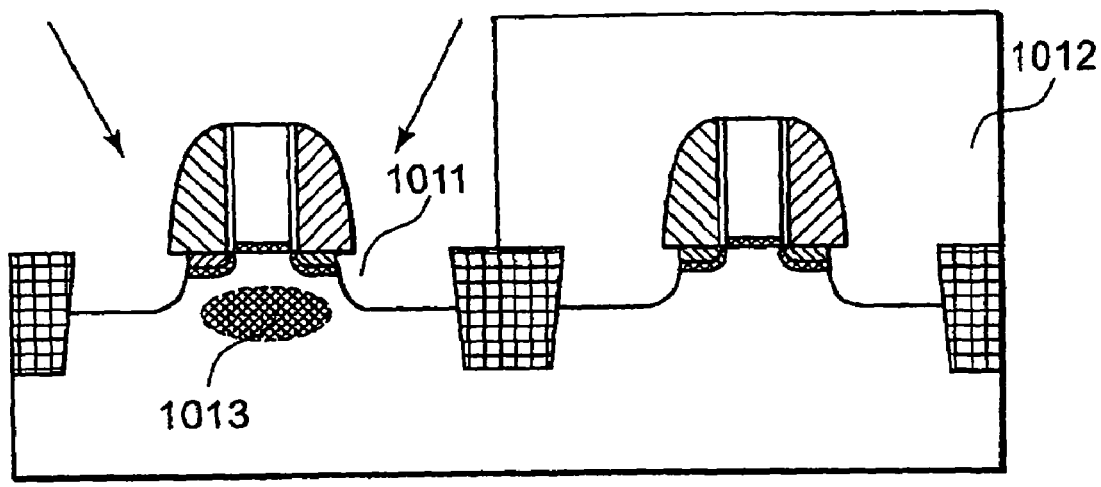
FIG. 10(d) is a fourth manufacturing process drawing of the semiconductor device according to Example 1-1 of the first embodiment of this invention.

Next, an exposed region in the substrate surrounded by the gate sidewall 1010 and the device isolation oxide film 1002, is etched to form the recess region 1011. After that, the mask 1012 is formed in the p-MOSFET region or the n-MOSFET region, and the impurity having the same conductivity with the well region is ion-injected obliquely. With this process, as illustrated in FIG. 10(d), a high concentration impurity region 1013 is formed below the channel region.

Figure 10E:
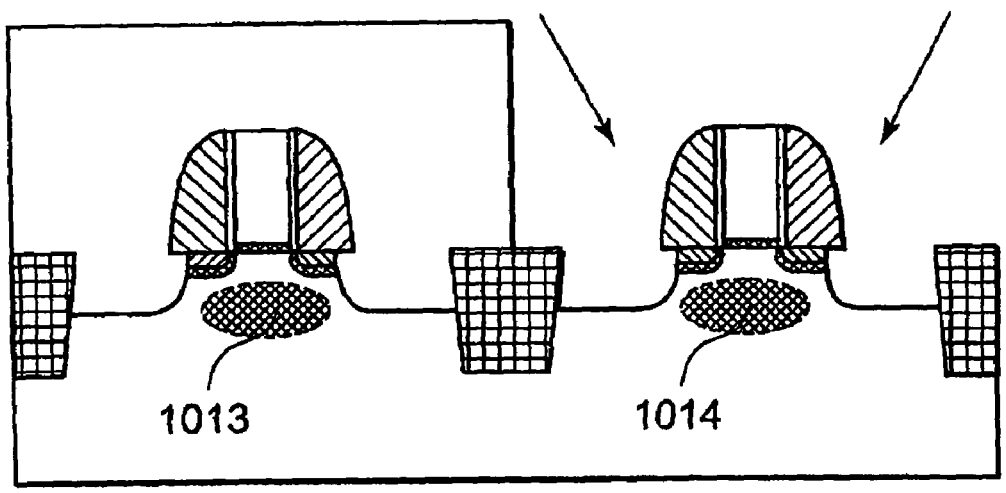
FIG. 10(e) is a fifth manufacturing process drawing of the semiconductor device according to Example 1-1 of the first embodiment of this invention.
Figure 10F:
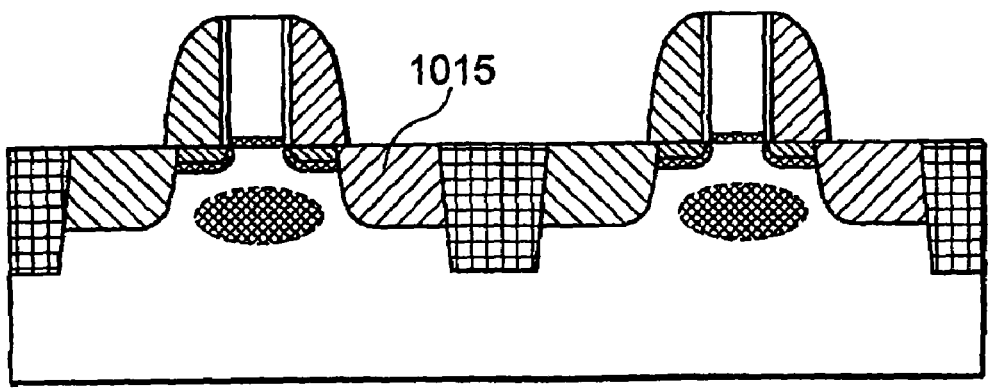
FIG. 10(f) is a sixth manufacturing process drawing of the semiconductor device according to Example 1-1 of the first embodiment of this invention.

After removing the mask, in a similar manner, the mask is also formed to the reverse type of MOSFET, and the ion injection is obliquely performed thereafter to form a high concentration impurity region 1014 having the same type with the well region (FIG. 10(e)).

The mask removal, crystallinity recovery, annealing also serving as crystallinity recovery and impurity activation, and washing of the surface of the recess region 1011 are performed, and after that, the recess region 1011 is buried back through the epitaxial growth by a material capable of being lattice align with Si substrate such as Si, SiGe, SiC or SiGeC.

Figure 11:
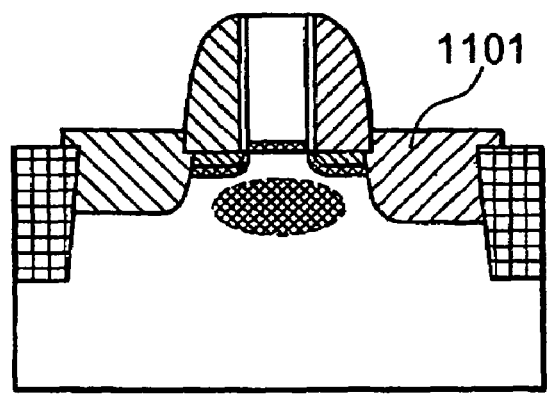
FIG. 11 is a modification example of the semiconductor device according to Example 1-1 of the first embodiment of this invention.

In this case, it is preferred that the epitaxial growth be selectively performed so that the device isolation oxide film 1002 and the gate sidewall 1010 are free from the epitaxial growth thereon. The epitaxial growth may be performed so that the substrate surface is buried back to original, or may be continued to obtain the so-called raised source/drain structure (refer to raised source/drain region 1101 in FIG. 11). After that, the ion injection is performed to form the source/drain region 1015 as shown in FIG. 10(*f*).

With the above-mentioned processes, a MOSFET structure according to the first embodiment of this invention is completed. Besides, the respective transistors are wired through the silicide region formed on the gate, the source, and drain regions. Although not shown, on top of the transistor element, the interlayer insulating film, a plug, and wirings are formed to function as LSI.

The thus manufactured MOSFET can improve the short channel effect to increase the substrate bias effect without increasing the impurity concentration of the channel region.

EXAMPLE 1-2

Figure 12A:
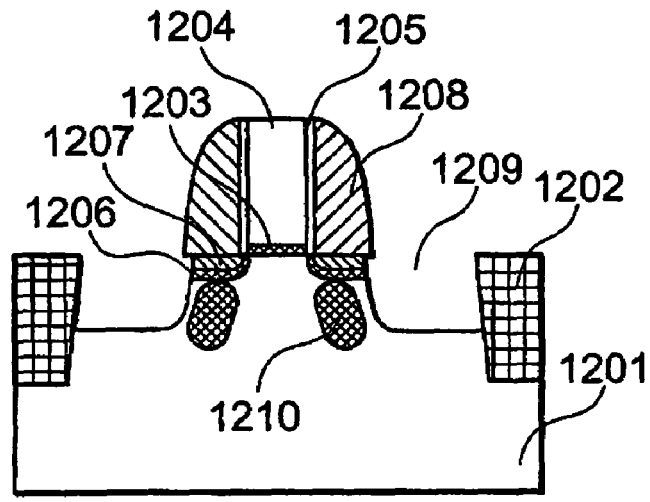
FIG. 12(a) is a first manufacturing process drawing of a semiconductor device according to Example 1-2 of the first embodiment of this invention.
Figure 12B:
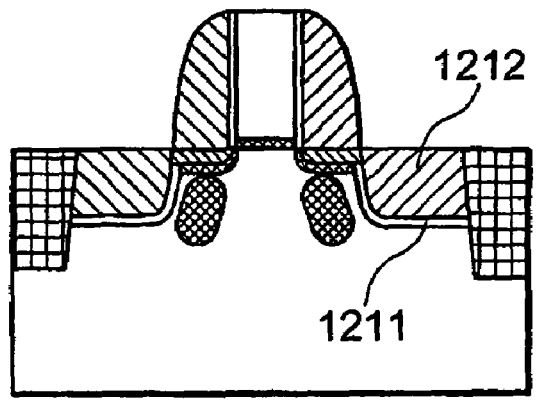
FIG. 12(b) is a second manufacturing process drawing of the semiconductor device according to Example 1-2 of the first embodiment of this invention.
Figure 13A:
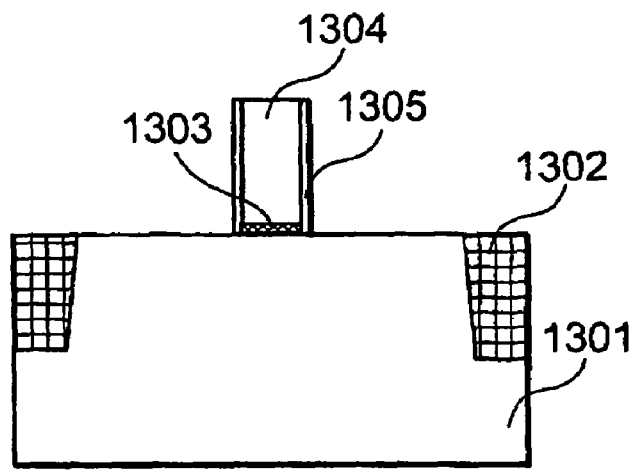
FIG. 13(a) is a first manufacturing process drawing of a semiconductor device according to Example 1-3 of the first embodiment of this invention.
Figure 13B:
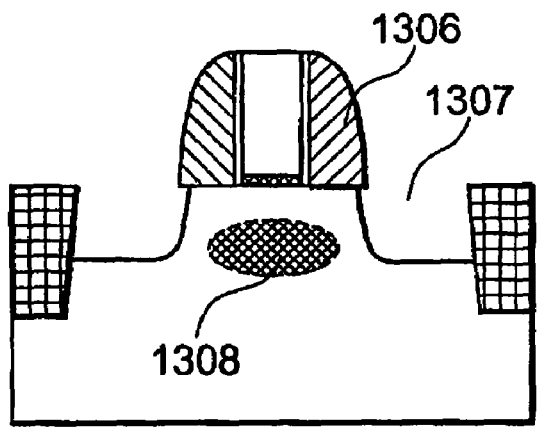
FIG. 13(b) is a second manufacturing process drawing of the semiconductor device according to Example 1-3 of the first embodiment of this invention.
Figure 13C:
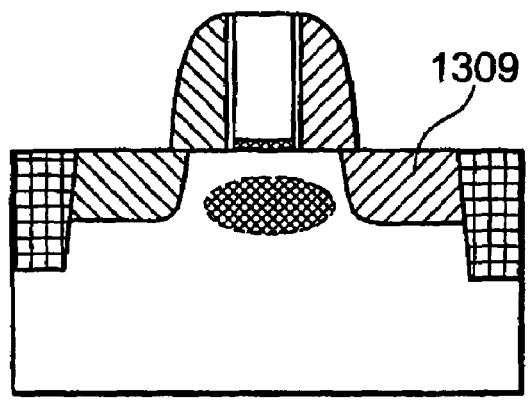
FIG. 13(c) is a third manufacturing process drawing of the semiconductor device according to Example 1-3 of the first embodiment of this invention.
Figure 13D:
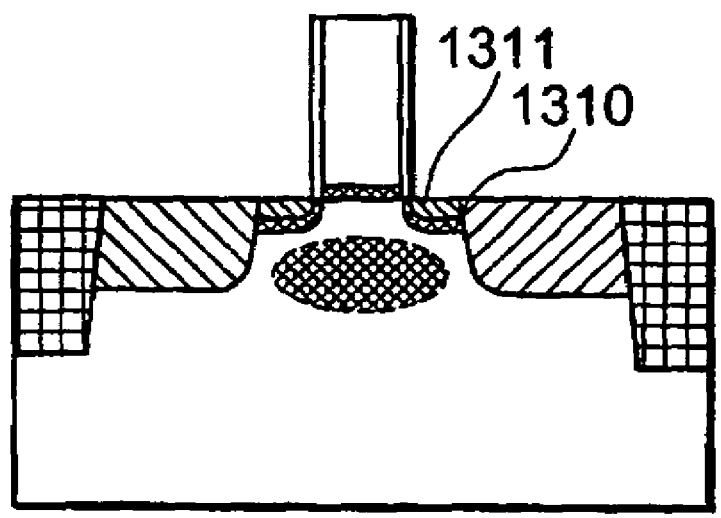
FIG. 13(d) is a fourth manufacturing process drawing of the semiconductor device according to Example 1-3 of the first embodiment of this invention.
Figure 13E:
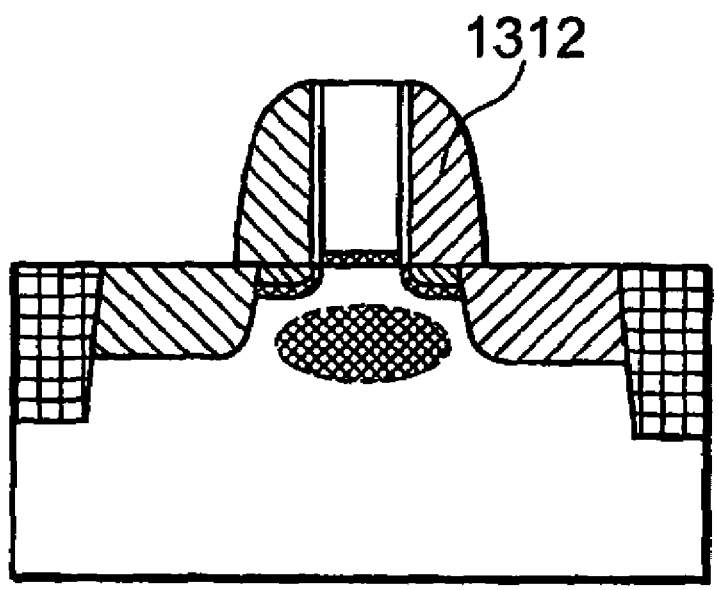
FIG. 13(e) is a fifth manufacturing process drawing of the semiconductor device according to Example 1-3 of the first embodiment of this invention.

Referring to FIGS. 12(*a*) and 12(*b*), a method of manufacturing a semiconductor device according to Example 1-2 of the first embodiment of this invention is described. Specifically, disclosed is a case where the recess region is buried back by using In-situ doping is performed. Example 1-2 discloses a case of p-MOSFET, however, n-MOSFET may be formed in the same manner. First, as shown in FIG. 12(*a*), as in Example 1-1, the formation is performed until the formation of a gate sidewall 1208, and a recess region 1209 is formed thereafter. After that, the impurity having the same type with the well is injected in an oblique direction to form a high concentration impurity region 1210. In this case, the low injection energy is used, so the high concentration impurity region 1210 is divided into lateral is described as an example. However, nothing is changed with Example 1-1, essentially.

Next, after the anneal process and the washing process before the film formation, which are necessary, as shown in FIG. 12(*b*), the recess region 1209 is buried back through the epitaxial growth by a chemical vapor deposition method (CVD). In this stage, by simultaneously supplying a diborane gas, there can be performed the In-situ dope, the buried back region may be used as the source/drain region as it is.

For example, in an early stage of the epitaxial growth, low boron concentration or non-doped Si is used to form a low concentration epitaxial region 1211. Successively, the boron concentration is increased to form a source/drain region 1212. Further, by sequentially changing the diborane flow rate to sequentially change the boron concentration of the source/drain region, it is possible to obtain an ideal source/drain profile. As described above, the introduction of the impurity opposite to the type of the well is performed by one of free from introducing and a small amount, and the introduction amount of the impurity opposite to the type of the well is increased thereafter to perform the epitaxial growth.

After that, the silicide electrode is formed on the source/drain/gate region, and after the necessary wiring process is finished, the final LSI is completed.

Thus formed MOSFET according to Example 1-2 may, in addition to an effect obtained in Example 1-1, be arbitrary change the impurity distribution of the source/drain region, in particular, a lateral direction impurity distribution, so the short channel characteristics of the MOSFET may further be improved.

EXAMPLE 1-3

Referring to FIGS. 13(*a*) to 13(*e*), a method of manufacturing a semiconductor device according to Example 1-3 of the first embodiment of this invention is described. Specifically, description is made of a case where after the formation of the oblique injection region and the source/drain region, SDE and Halo region formations are performed, and of the method thereof. Example 1-3 discloses a case of the p-MOSFET, however, the n-MOSFET may be formed in the same manner.

First, as shown in FIG. 13(*a*), as in Example 1-1, the formation is performed until the formations of the gate electrode 1304 and the offset spacer 1305. Successively, as shown in FIG. 13(*b*), an oxide film, a nitride film, or a lamination film thereof is deposited, and a gate sidewall 1306 is formed through etchback.

An exposed region of the substrate 1301 surrounded by the gate sidewall 1306 and the device isolation oxide film 1302 is etched to form the recess region 1307. After that, the impurity having the same type with the well is injected in an oblique direction to form a high concentration impurity region 1308.

Next, after the anneal process and the washing process before the film formation, which are necessary, as shown in FIG. 13(*c*), the recess region 1307 is buried back through the epitaxial growth by a chemical vapor deposition method (CVD). Then, a source/drain region 1309 is formed through the In-situ dope or the ion injection and the anneal.

As shown in FIG. 13(*d*), the gate sidewall 1306 is removed and Halo injection and SDE injection are performed to form a Halo injection region 1310 and an SDE diffusion region 1311 are formed.

As shown in FIG. 13(*e*), a gate sidewall 1312 foamed of an oxide film, a nitride film, or a lamination film thereof is formed. Further, for the activation of Halo and SDE, anneal treatment is performed. The order of the anneal treatment may be performed before and after the formation of a gate sidewall 1312. After that, the necessary silicide electrode formation and the wiring process are performed to provide the functions as LSI.

Thus manufactured MOSFET may obtain SDE having an extremely steep profile, it is possible to further improve the short channel effect in addition to the effect of the oblique injection.

Second Embodiment

Referring to the drawings, description is made of a method of manufacturing a semiconductor according to a second embodiment of this invention.

EXAMPLE 2-1

Referring to FIGS. 14(*a*) to 14(*f*), a method of manufacturing a semiconductor device according to Example 2-1 of the second embodiment of this invention is described. Specifically, description is made of a case where the recess is performed after the formation of the gate electrode, and then the oblique injection is performed. Example 2-1 describes as an example the formation method for the p-MOSFET, the n-MOSFET may be formed in the similar manner.

As in the same way of Example 1-1 of the first embodiment, formation is performed until the formations of the gate electrode 1404 and the offset spacer 1405 (FIG. 14(*a*)). Successively, as shown in FIG. 14(*b*), an exposure portion of a substrate 1401 surrounded by an offset spacer 1405 and a device isolation oxide film 1402 is etched to form a recess region 1406. After that, the impurity having the same type with the well is injected i an oblique direction to form a high concentration impurity region 1407. In this case, it is preferred that the injection energy be set to low for preventing the excess ion injection into the channel region through the oblique injection.

Figure 14A:
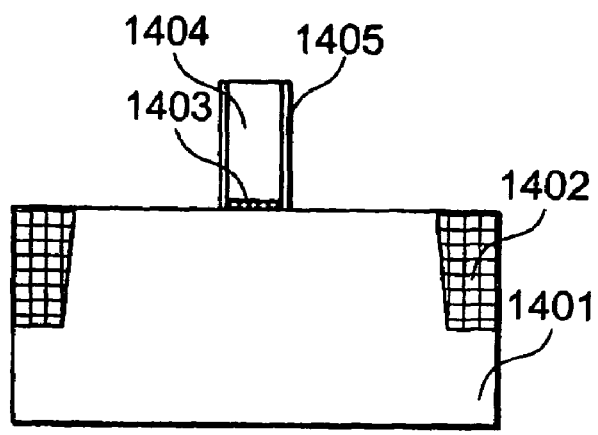
FIG. 14(a) is a first manufacturing process drawing of a semiconductor device according to Example 2-1 of a second embodiment of this invention.
Figure 14B:
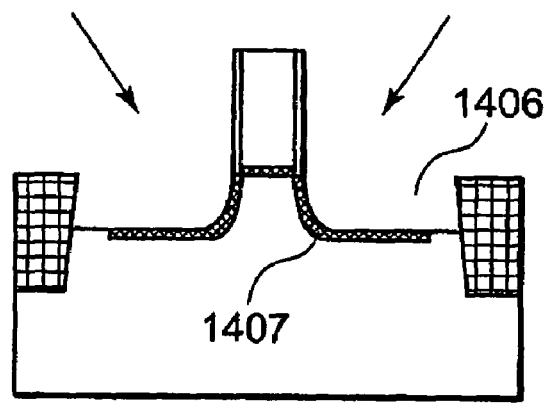
FIG. 14(b) is a second manufacturing process drawing of the semiconductor device according to Example 2-1 of the second embodiment of this invention.
Figure 14C:
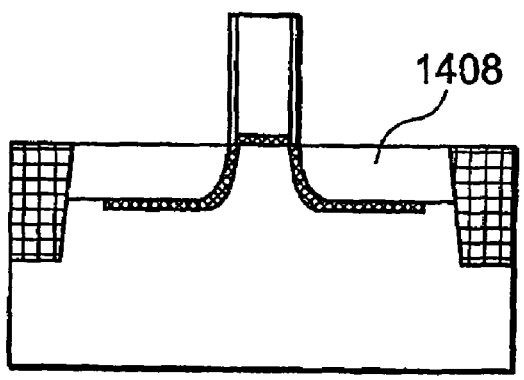
FIG. 14(c) is a third manufacturing process drawing of the semiconductor device according to Example 2-1 of the second embodiment of this invention.

Next, after the anneal process and the washing process before the film formation, which are necessary, as shown in FIG. 14(c), the recess region 1407 is buried back through the epitaxial growth by a chemical vapor deposition method (CVD). When performing the buried back, the In-situ may be performed to contain the impurity having the same type with the well into the buried back region.

Figure 14D:
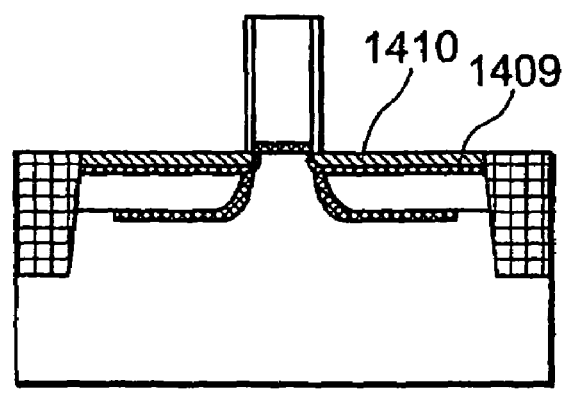
FIG. 14(d) is a fourth manufacturing process drawing of the semiconductor device according to Example 2-1 of the second embodiment of this invention.

After that, as shown in FIG. 14(d), using the gate electrode 1404 and the offset spacer 1405 as the mask, the Halo injection and the SDE injection are performed to form a Halo injection region 1409 and an SDE diffusion region 1410.

Figure 14E:
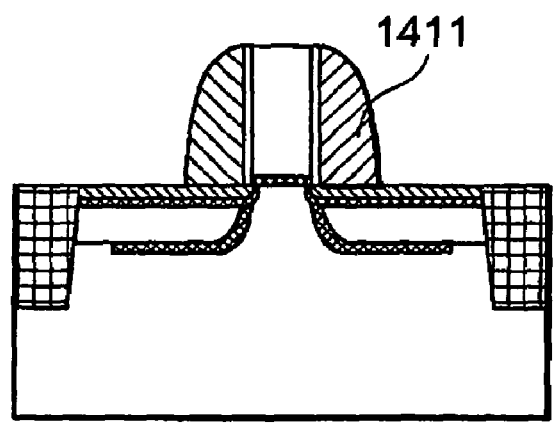
FIG. 14(e) is a fifth manufacturing process drawing of the semiconductor device according to Example 2-1 of the second embodiment of this invention.
Figure 14F:
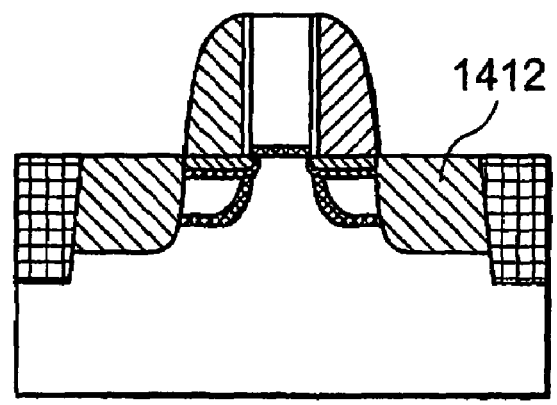
FIG. 14(f) is a sixth manufacturing process drawing of the semiconductor device according to Example 2-1 of the second embodiment of this invention.

Next, as shown in FIG. 14(e), a gate sidewall 1411 formed of an oxide film, a nitride film, or a lamination film thereof is formed. As shown in FIG. 14(f), the source/drain injection is performed using the gate sidewall 1411 as the mask to form a source/drain region 1412. After that, the anneal for activation is performed. After that, the necessary suicide electrode formation and the wiring process are performed to provide the functions as LSI. The thus manufactured MOSFET can improve the short channel effect and increase the substrate bias effect without increasing the impurity concentration of the channel region.

The invention claimed is:

1. A metal-oxide-semiconductor field-effect transistor (MOSFET), comprising:
   a gate electrode formed on a semiconductor substrate and an insulating film;
   a sidewall insulating film covering a side surface of the gate electrode;
   a source region and a drain region surrounded by the sidewall insulating film; and
   a shallow trench isolation in a self-alignment manner,
   wherein an impurity concentration of a first conductivity type which is the same type as a well-forming impurity has a profile becoming, in a lower direction of the gate electrode, lower at a channel formation region, then higher and again lower, and
   wherein a high-concentration first conductivity type impurity region is provided, in which the impurity concentration of the first conductivity type is formed to be low in the source region and the drain region and to be high below the gate electrode sandwiched between the source and drain region.

2. The MOSFET according to claim 1, wherein each of the source region and the drain region is formed such that, on a line in a lateral direction crossing the source region and the drain region, the impurity concentration having the same type with the well is low in the source and drain region, is high at both ends adjacent to and sandwiched by the source and drain region, and is relatively low at a center portion of the source and drain region.

3. The MOSFET according to claim 1, wherein the concentration of the first conductivity type impurity below the source region and the drain region is lower than the concentration of the high concentration impurity region below the gate electrode.

4. The MOSFET according to claim 1, wherein each of the source region and the drain region is free from containing the first conductivity type impurity.

5. The MOSFET according to claim 1, wherein each of the Source region and the drain region is substantially free from containing the first conductivity type impurity in a p-n junction surface.

6. The MOSFET according to claim 1, wherein each of the source region and the drain region comprises as a main structural element at least one element selected from Si, Ge, and C.

7. The MOSFET according to claim 1, wherein each of the source region and the drain region is buried by a metal.

8. The MOSFET according to claim 1, wherein each of the source region and the drain region is raised to a position which is higher than a substrate surface of the channel formation region.

9. A method of manufacturing a semiconductor device, said semiconductor device comprising:
   a semiconductor substrate;
   an insulating film;
   a gate electrode in a stated order;
   a source region and a drain region surrounded by a sidewall insulating film covering a side surface of the gate electrode; and
   a shallow trench isolation in a self-alignment manner, said method comprising:
      etching the source region and the drain region to form a recess after formation of the gate electrode; and
      obliquely ion-injecting, at a region of the semiconductor substrate below the gate electrode, a first conductivity type impurity having the same type with an impurity forming a well.

10. The method of manufacturing a semiconductor device according to claim 9, wherein an angle of the ion injection with respect to a plane of the semiconductor substrate is larger than an angle determined by inverse tangent of a height of the gate electrode and a minimum interval of the gate electrode.

11. The method of manufacturing a semiconductor device according to claim 9, wherein the injection direction of the ion injection is free from overlapping with a longitudinal direction of the gate electrode.

12. The method of manufacturing a semiconductor device according to claim 9, further comprising an annealing treatment for recovery of crystallinity of the semiconductor substrate after the ion injection.

13. The method of manufacturing a semiconductor device according to claim 9, further comprising selectively epitaxial-growing a material containing at least one element selected from the Si, Ge, and C at the recessed source region and the drain region.

14. The method of manufacturing a semiconductor device according to claim 13, wherein an impurity opposite to a type of the well is introduced in the epitaxial growth.

15. The method of manufacturing a semiconductor device according to claim 13, wherein an impurity having the same type with the well is introduced in the epitaxial growth.

16. The method of manufacturing a semiconductor device according to claim 14, wherein in an early stage of the epitaxial growth, an introduction of the impurity opposite to the type of the well is performed by one of free from introducing and a small amount, and the introduction amount of the impurity opposite to the type of the well is increased thereafter to perform the epitaxial growth.

17. The method of manufacturing a semiconductor device according to claim 9, wherein each of the source region and the drain region is raised to a higher position than a surface of the semiconductor substrate.

18. The method of manufacturing a semiconductor device according to claim 9, wherein, after burying of the source region and the drain region, the sidewall insulating film is removed by etching and Halo injection and Extension injection are performed.

19. The method of manufacturing a semiconductor device according to claim 9, further comprising, after formation of the gate sidewall insulating film, etching the source region and the drain region to form the recess.

20. The MOSFET according to claim 1, further comprising:
a source extension injection region formed below the sidewall insulating film, the source extension injection region being in contact with the source region;
a drain extension injection region formed below the sidewall insulating film, the drain extension injection region being in contact with the drain region;
a source halo injection region formed above the high-concentration first conductivity type impurity region; and
a drain halo injection region formed above the high-concentration first conductivity type impurity region.

* * * * *